US006870710B2

(12) United States Patent
Hida et al.

(10) Patent No.: US 6,870,710 B2
(45) Date of Patent: Mar. 22, 2005

(54) PIEZOELECTRIC ACTUATOR, DRIVING METHOD AND INFORMATION STORAGE DEVICE

(75) Inventors: Masaharu Hida, Kawasaki (JP); Tsuyoshi Mita, Kawasaki (JP); Kazuaki Kurihara, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/357,047

(22) Filed: Feb. 3, 2003

(65) Prior Publication Data

US 2003/0133230 A1 Jul. 17, 2003

Related U.S. Application Data

(63) Continuation of application No. PCT/JP01/02417, filed on Mar. 26, 2001.

(30) Foreign Application Priority Data

Oct. 20, 2000 (JP) ........................................ 2000-321153

(51) Int. Cl.$^7$ ................................................ G11B 5/58
(52) U.S. Cl. ..................... 360/294.4; 310/311; 310/331
(58) Field of Search ...................... 360/294.4; 310/311, 310/312, 321, 328, 331

(56) References Cited

U.S. PATENT DOCUMENTS

| | | | | | |
|---|---|---|---|---|---|
| 4,491,761 | A | * | 1/1985 | Grudkowski et al. | 310/359 |
| 5,682,076 | A | * | 10/1997 | Zumeris | 360/78.05 |
| 5,693,997 | A | * | 12/1997 | Griffith et al. | 310/328 |
| 5,764,444 | A | * | 6/1998 | Imamura et al. | 360/294.4 |
| 6,236,140 | B1 | * | 5/2001 | Arimura | 310/312 |
| 6,246,552 | B1 | * | 6/2001 | Soeno et al. | 360/294.4 |
| 6,268,983 | B1 | * | 7/2001 | Imada et al. | 360/294.3 |
| 6,362,938 | B1 | * | 3/2002 | Suzuki et al. | 360/294.4 |
| 6,465,934 | B1 | * | 10/2002 | Takeuchi et al. | 310/321 |
| 6,512,659 | B1 | * | 1/2003 | Hawwa et al. | 360/294.6 |
| 6,538,854 | B2 | * | 3/2003 | Koganezawa et al. | 360/294.4 |
| 2003/0142448 | A1 | * | 7/2003 | Koganezawa | 360/294.4 |

FOREIGN PATENT DOCUMENTS

| | | |
|---|---|---|
| JP | 60-025284 | 2/1985 |
| JP | 62-287480 | 12/1987 |
| JP | 03-097174 | 4/1991 |
| JP | 10-136665 | 5/1998 |
| JP | 10-293979 | 11/1998 |
| JP | 11-031368 | 2/1999 |
| JP | 11-143541 | 5/1999 |
| JP | 11-273041 | 10/1999 |
| JP | 2000-268517 | 9/2000 |
| WO | WO98/19304 | 5/1998 |

* cited by examiner

Primary Examiner—Jefferson Evans
(74) Attorney, Agent, or Firm—Greer, Burns & Crain, Ltd.

(57) ABSTRACT

The present invention aims to provide a compact and lightweight piezoelectric actuator, a driving method involving the piezoelectric actuator that can provide a large displacement at a low voltage, and a compact and lightweight information storage device with a high recording density that incorporates such a piezoelectric actuator and has a small moment of inertia of a head when the head is driven. The piezoelectric actuator according to the present invention has four rod-shaped driving sections. Of the four rod-shaped driving sections, a voltage is applied to the two driving sections located along a diagonal line at a time, and the voltage is applied to the two driving sections located along the other diagonal line at a different time from the time for the first two driving sections, whereby two central sections are rotationally driven relative to two end sections.

8 Claims, 26 Drawing Sheets ical actuator, a
PIEZOELECTRIC ACTUATOR, DRIVING METHOD AND INFORMATION STORAGE DEVICE This is a continuation of International PCT Application No. PCT/JP01/02417 filed Mar. 26, 2001.

TECHNICAL FIELD

The present invention relates to a piezoelectric actuator, a driving method by means of the piezoelectric actuator and an information storage device incorporating the piezoelectric actuator.

BACKGROUND ART

Hard disk drives are conventionally known information storage devices that are to be incorporated into or connected to an electronic apparatus, such as a personal computer and a word processor. A typical hard disk drive comprises a disk serving as an information storage medium, a head for reading/writing recording bits from/to the disk, an arm for holding the head in the vicinity of the disk, and an electromagnetic actuator for driving the arm to move the head along the disk.

With the development of the personal computers and the like, the hard disk drives have become higher in recording density. In particular, the personal computers or the like have become increasingly required to process image data or music data in recent years, and accordingly, the recording density of the hard disk drives has been dramatically increased. With the increase in the recording density of the hard disk drives, recording bits on a disk have become finer and the rotational speed of the disk has become higher, and therefore, it has become required to position the head more precisely in a shorter time. In addition, miniaturization and power saving of the hard disk drives are being promoted.

There has been proposed a hard disk drive which has, in addition to the conventional electromagnetic actuator, a piezoelectric actuator provided in the middle of the arm to position the head more precisely in a shorter time.

However, the piezoelectric actuators and hard disk drives proposed in the past have disadvantages in that they can only provide an insufficient displacement of the head, need a high driving voltage, are bulky and heavy, have a large moment of inertia of the head when the head is driven and are produced at a high cost.

These disadvantages are not specific to the hard disk drives but are common to the types of information storage devices that have a head held and moved by an arm.

DISCLOSURE OF THE INVENTION

The present invention has been devised in view of such circumstances. An object of the present invention is to provide a compact and lightweight piezoelectric actuator, a driving method involving the piezoelectric actuator that can provide a large displacement at a low voltage, and a compact and lightweight information storage device with a high recording density that incorporates such a piezoelectric actuator and has a small moment of inertia of a head when the head is driven.

A first piezoelectric actuator according to the present invention that attains the object described above is characterized in that it comprises:

a first rod-shaped driving section that is longitudinally shrunk or elongated when a voltage is applied thereto or removed therefrom;

a second rod-shaped driving section that is disposed in parallel with the first driving section and is longitudinally shrunk or elongated when a voltage is applied thereto or removed therefrom;

a first end section to which both of one end of the first driving section and one end, which is located beside the one end of the first driving section, of the second driving section are connected;

a first central section connected to the other end of the first driving section of which one end is connected to the first end section;

a second central section connected to the other end of the second driving section of which one end is connected to the first end section;

a third rod-shaped driving section that extends from the first central section in a direction opposite to the first driving section and is longitudinally shrunk or elongated when a voltage is applied thereto or removed therefrom;

a fourth rod-shaped driving section that extends from the second central section in a direction opposite to the second driving section and is longitudinally shrunk or elongated when a voltage is applied thereto or removed therefrom; and a second end section to which the other end of the third driving section than one end connected to the first central section and the other end of the fourth driving section than one end connected to the second central section are connected.

A second piezoelectric actuator according to the present invention that attains the object described above is characterized in that it comprises:

a plurality of driving sections each of which has a first driving end and a second driving end and drives the second driving end back and forth relative to the first driving end in a predetermined driving direction; and a base to which the first driving ends of the plurality of driving sections are connected and which holds the plurality of driving sections in a rotational symmetry and line asymmetry arrangement as a whole, and the driving section comprises:

a first rod-shaped driving body that extends from the first driving end in the driving direction and is longitudinally shrunk or elongated when a voltage is applied thereto or removed therefrom;

a second rod-shaped driving body that extends from the second driving end, in the same direction as the first driving body, and in parallel with the first driving body and is longitudinally shrunk or elongated when a voltage is applied thereto or removed therefrom; and a fixture that fixes the other end of the first driving body than one end connected to the first driving end and the other end of the second driving body than one end connected to the second driving end.

Here, the first central section and second central section of the first piezoelectric actuator may be separated from each other or coupled with each other. Besides, the first driving section, the second driving section, the third driving section, the fourth driving section, the first driving body and the second driving body may be elongated or shrunk when the voltage is applied thereto.

A driving method according to the present invention that attains the object described above is characterized in that a voltage is applied to the first driving section and fourth driving section of the above-described first piezoelectric actuator of the present invention at a same time and the voltage is applied to the second driving section and third driving section of the piezoelectric actuator simultaneously at a different time from the time for the first and fourth driving sections, whereby a central section pair of the first central section and the second central section is rotationally driven relative to an end section pair of the first end section and the second end section.

The piezoelectric actuator of the present invention has a simple structure and can be realized as a compact and lightweight actuator. In addition, according to the driving method of the present invention, since an object to be driven is rotationally driven, the object can be largely displaced at a low voltage.

An information storage device according to the present invention that attains the object described above is characterized in that it comprises:

a head section on which a head is mounted that performs at least one of information recording in a predetermined information storage medium and information regeneration from the predetermined information storage medium;

an arm section that holds the head section in such a manner that the head mounted on the head section is brought close to or into contact with the information storage medium;

an arm section actuator that drives the arm section to move the head mounted on the head section held by the arm section along the information storage medium; and a head section actuator that rotates the head section relative to the arm section about the center of gravity of the head section, and the head section actuator is the first or second piezoelectric actuator of the present invention.

Here, the arm section may directly hold the head section or indirectly hold it via the head section actuator or the like. Besides, if the second piezoelectric actuator is adopted as the head section actuator, the second driving end may be directly fixed to the head section or indirectly fixed thereto via a jig or the like.

For the information storage device according to the present invention, the head has a small moment of inertia when being driven since the head section rotates about the center of gravity thereof. Since the head actuator incorporated in the information storage device of the present invention is compact and lightweight and can precisely position the head, the information storage device of the present invention can be realized as a compact and lightweight device with a high recording density.

BEST MODE FOR CARRYING OUT THE INVENTION

Embodiments of the present invention will be described below.

Figure 1:
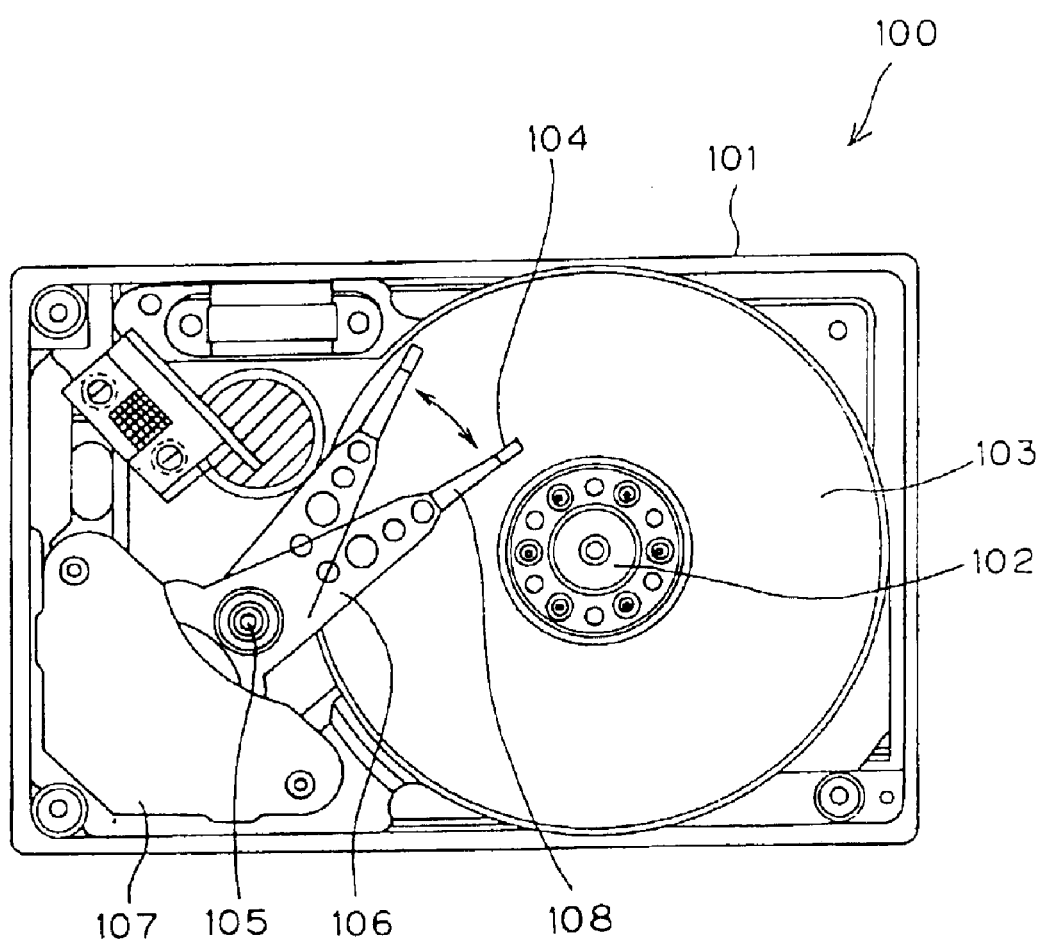
FIG. 1 shows an information recording device according to a first embodiment of the present invention.

FIG. 1 shows an information recording device according to a first embodiment of the present invention.

A hard disk drive (HDD) 100 shown in the drawing is equivalent to the information recording device according to the first embodiment of the present invention. A housing 101 of the hard disk drive 100 houses a magnetic disk 103 rotatably attached to a rotational shaft 102, a slider 104 having mounted thereon a magnetic head for recording/regenerating information in/from the magnetic disk 103, a suspension 108 for holding the slider 104, a carriage arm 106 to which the suspension 108 is secured and which moves along a surface of the magnetic disk 103 about an arm axis 105, and an arm actuator 107 for driving the carriage arm 106. The magnetic disk 103 in the hard disk drive 100 shown in FIG. 1 is one example of an information storage medium of the present invention. The magnetic head and the slider 104 constitute a head section of the present invention, and the suspension 108 and the carriage arm 106 constitute an arm section of the present invention. Therefore, the arm actuator 107 is equivalent to an arm section actuator of the present invention. In addition, a piezoelectric actuator, described later, is provided on a tip end of the suspension 108, the piezoelectric actuator being one example of a head section actuator of the present invention and equivalent to a piezoelectric actuator according to the first embodiment of the present invention.

In recording information in the magnetic disk or regenerating information stored in the magnetic disk 103, the arm actuator 107, which is composed of a magnetic circuit, drives the carriage arm 106, and the piezoelectric actuator, described later, drives the slider 104, whereby the magnetic head is positioned over a predetermined track on the rotating magnetic disk 103. As the magnetic disk 103 rotates, the magnetic head mounted on the slider 104 is sequentially brought close to each micro-area in each track on the magnetic disk 103. When recording information in the magnetic disk, an electric recording signal is input to the magnetic head close to the magnetic disk 103, and the magnetic head applies a magnetic field depending on the recording signal to a corresponding micro-area, whereby the information carried on the recording signal is recorded in the each micro-area in the form of a direction of magnetization. When regenerating information from the magnetic disk, the information recorded in the form of the direction of magnetization of the each micro-area is extracted by the magnetic head in the form of an electric regeneration signal associated with the magnetic field produced by the magnetization. The interior space of the housing 101 is enclosed with a cover, not shown.

In all the embodiments described later, the hard disk drive has the same structure as that shown in FIG. 1, except for the arrangement of the tip end of the suspension 108 and its peripheral components. In the following, the embodiments will be described only in terms of the arrangement of the tip end of the suspension 108 and its peripheral components.

The embodiments described below may be divided into two types. The first type will now be described.

Figure 2:
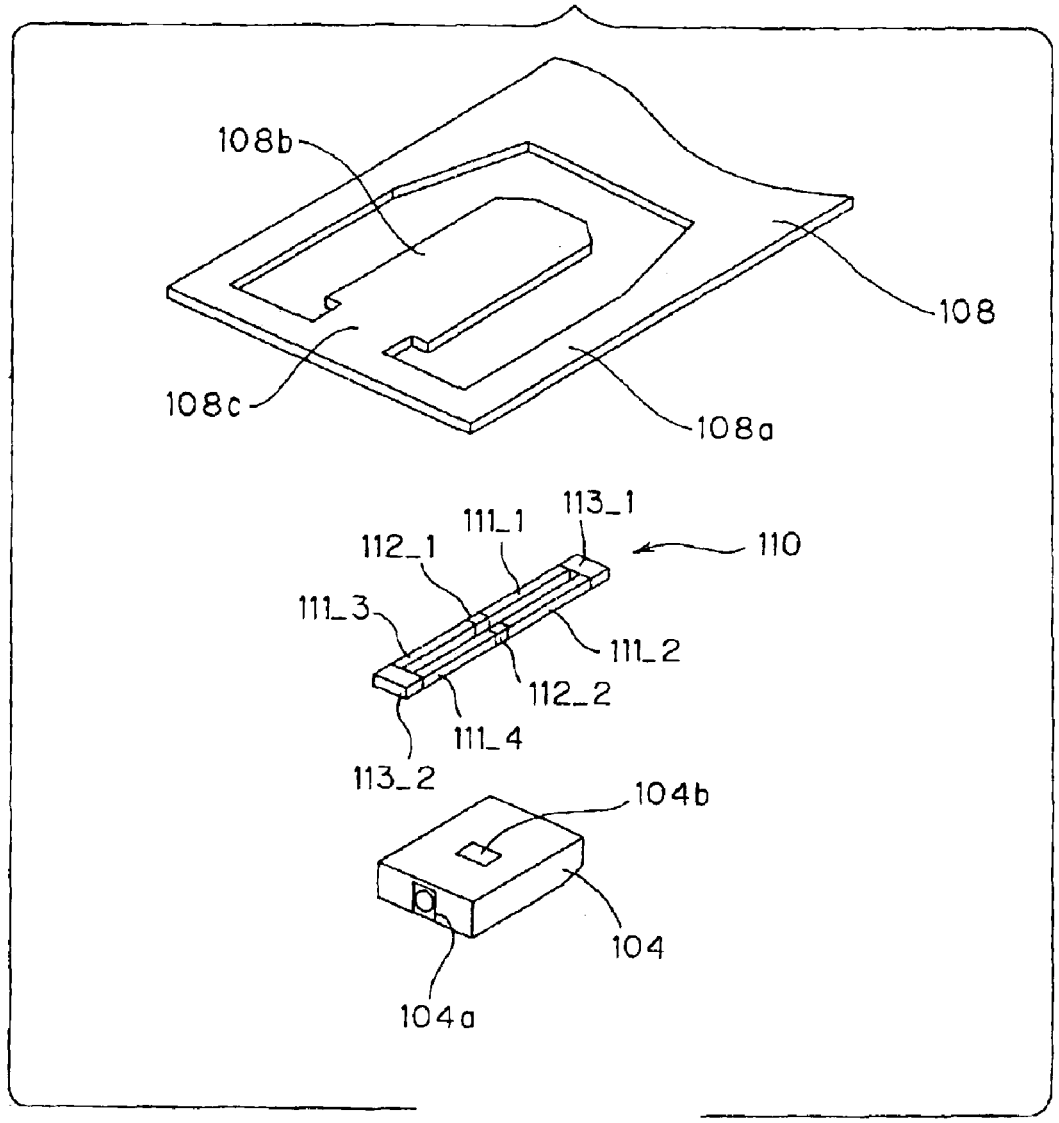
FIG. 2 is an exploded perspective view showing a tip end of a suspension and its peripheral components according to the first embodiment.
Figure 3:
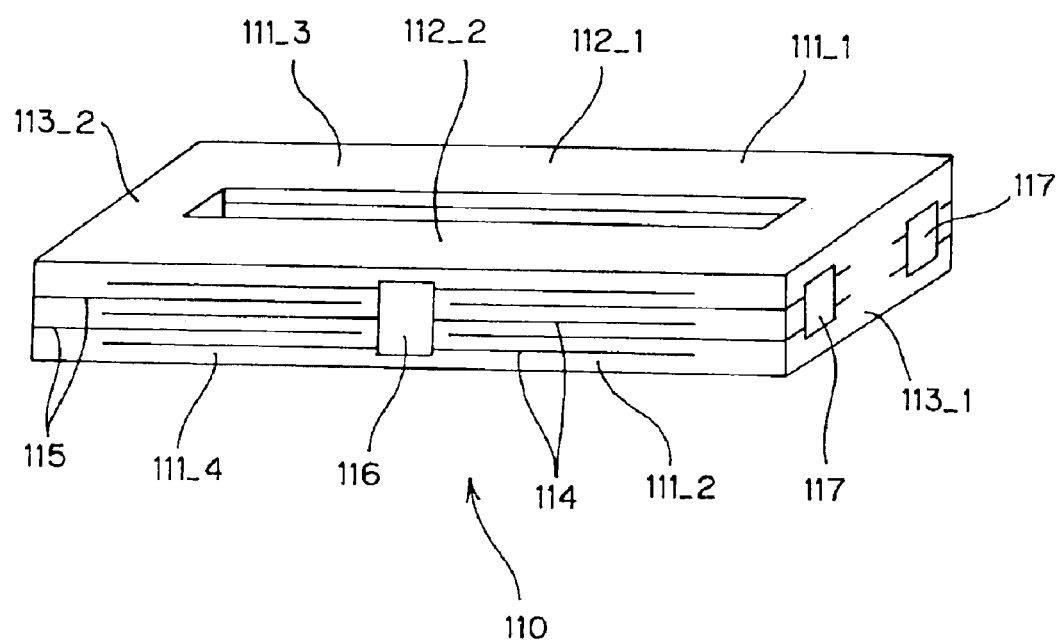
FIG. 3 is a perspective view showing a piezoelectric actuator according to the first embodiment of the present invention.
Figure 4:
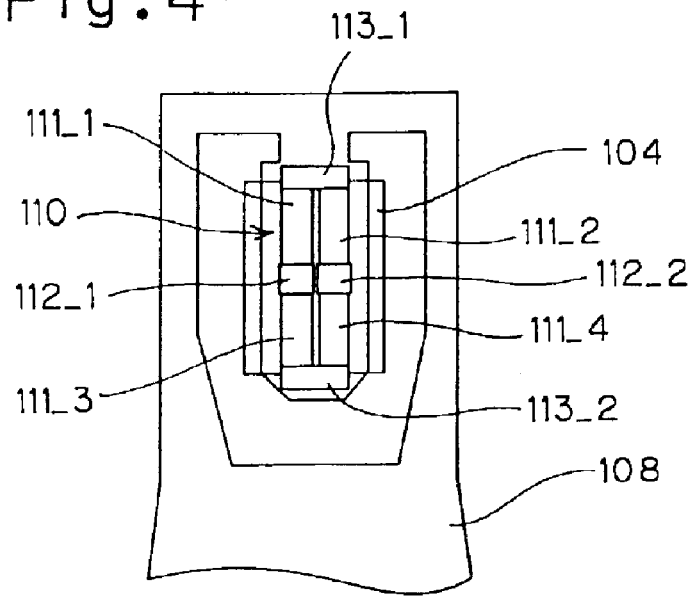
FIG. 4 is a front view of the tip end of the suspension and its peripheral components.

FIG. 2 is an exploded perspective view showing the tip end of the suspension and its peripheral components according to the first embodiment. FIG. 3 is a perspective view showing the piezoelectric actuator according to the first embodiment of the present invention. FIG. 4 is a front view of the tip end of the suspension and its peripheral components. In the following, description will be made with reference to these drawings.

The suspension 108 comprises a main body 108a and a holder section 108b, and the holder section 108b serves as a plate spring because it can be elastically deformed at a connection 108c to the main body 108a.

A magnetic head 104a is mounted on an end face of the slider 104.

A piezoelectric actuator 110 is secured to the holder section 108b of the suspension 108 with an epoxy adhesive or the like, and the slider 104 is secured to the piezoelectric actuator 110.

The piezoelectric actuator 110 is formed as an integral unit as described later. However, in terms of functionality, it can be divided into four rod-shaped driving sections 111_1, 111_2, 111_3 and 111_4, two central sections 112_1 and 112_2, and two end sections 113_1 and 113_2.

Each of the four driving sections 111_1, 111_2, 111_3 and 111_4 has a multilayer structure comprising a common electrode layer 114 made of a conductive material, a separate electrode layer 115 made of a conductive material and a piezoelectric layer made of a piezoelectric material sandwiched between the electrode layers 114 and 115. Thus, the four driving sections 111_1, 111_2, 111_3 and 111_4 are so-called active sections. When a voltage is applied between the common electrode layer 114 and the separate electrode layer 115, the driving sections 111_1, 111_2, 111_3 and 111_4 are each longitudinally shrunk due to the piezoelectric transverse effect (31 mode), and when the applied voltage is removed, they are each longitudinally elongated. The common electrode layer 114 has a potential common to the four driving sections 11_1, 111_2, 111_3 and 111_4, and the separate electrode layer 115 has a different potential set for each of the four driving sections 111_1, 111_2, 111_3 and 111_4.

On the other hand, each of the two central sections 112_1 and 112_2 and the two end sections 113_1 and 113_2 has a structure in which one of the common electrode layer 114 and separate electrode layer 115 and the piezoelectric layer are alternately stacked. Thus, the two central sections 112_1 and 112_2 and the two end sections 113_1 and 113_2 are so-called inactive sections and are not shrunk or elongated if the common electrode layer 114 or separate electrode layer 115 has any potential. In addition, a common electrode terminal 116 connected to the common electrode layer 114 and a separate electrode terminal 117 connected to the separate electrode layer 115 are provided on side surfaces of the piezoelectric actuator 110. The voltage is applied between the common electrode layer 114 and the separate electrode layer 115 via the common electrode terminal 116 and the separate electrode terminal 117. In the following, simply describing that "a voltage is applied to the driving section" may mean that a voltage is applied between the common electrode layer and the separate electrode layer of the driving section.

Sections of the piezoelectric actuator 110, which is secured to the suspension 108 and the slider 104 may be a pair of sections, that is, the two central sections 112_1 and 112_2, and a pair of end sections, that is, the two end sections 113_1 and 113_2. In other words, the central section pair may be secured to the suspension 108 and the end section pair may be secured to the slider 104. Alternatively, the end section pair may be secured to the suspension 108 and the central section pair may be secured to the slider 104. In the following, description will be made assuming that the end section pair is secured to the holder section 108b of the suspension 108 and the central section pair is secured to a securing section 104b of the slider 104.

The piezoelectric actuator 110 rotationally drives the slider 104 relative to the suspension 108 according to a principle described later.

Figure 5:
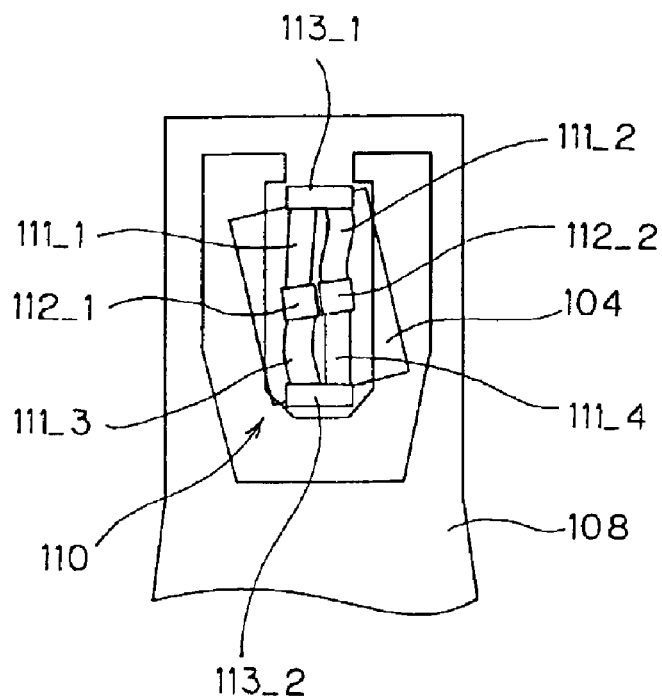
FIG. 5 illustrates a principle of driving the piezoelectric actuator according to the first embodiment.

FIG. 5 illustrates a principle of driving the piezoelectric actuator according to the first embodiment.

In this drawing, of the four driving sections 111_1, 111_2, 111_3 and 111_4, the second driving section 111_2 and the third driving section 111_3 located along one diagonal line are shrunk simultaneously, and the first driving section 111_1 and the fourth driving section 111_4 located along the other diagonal line are not shrunk. Accordingly, the pair of two central sections 112_1 and 112_2 are rotationally driven relative to the pair of two end sections 113_1 and 113_2. As a result, the slider 104 secured to the central section pair is rotationally driven relative to the suspension 108 secured to the end section pair, whereby the magnetic head is largely displaced. Since the central section pair is secured to the center of the slider 104, the slider 104 is rotationally driven about the center of gravity, and thus, has a small moment of inertia when driving the head. In addition, since the end section pair is secured to the suspension and the central section pair is secured to the slider, the piezoelectric actuator 110 itself does not rotate, so that the moment of inertia thereof is suppressed.

If the first driving section 111_1 and the fourth driving section 111_4 are shrunk simultaneously, and the second driving section 111_2 and the third driving section 111_3 are not shrunk, the slider 104 can be quickly rotationally driven in the opposite direction to that shown in FIG. 5.

Figure 6:
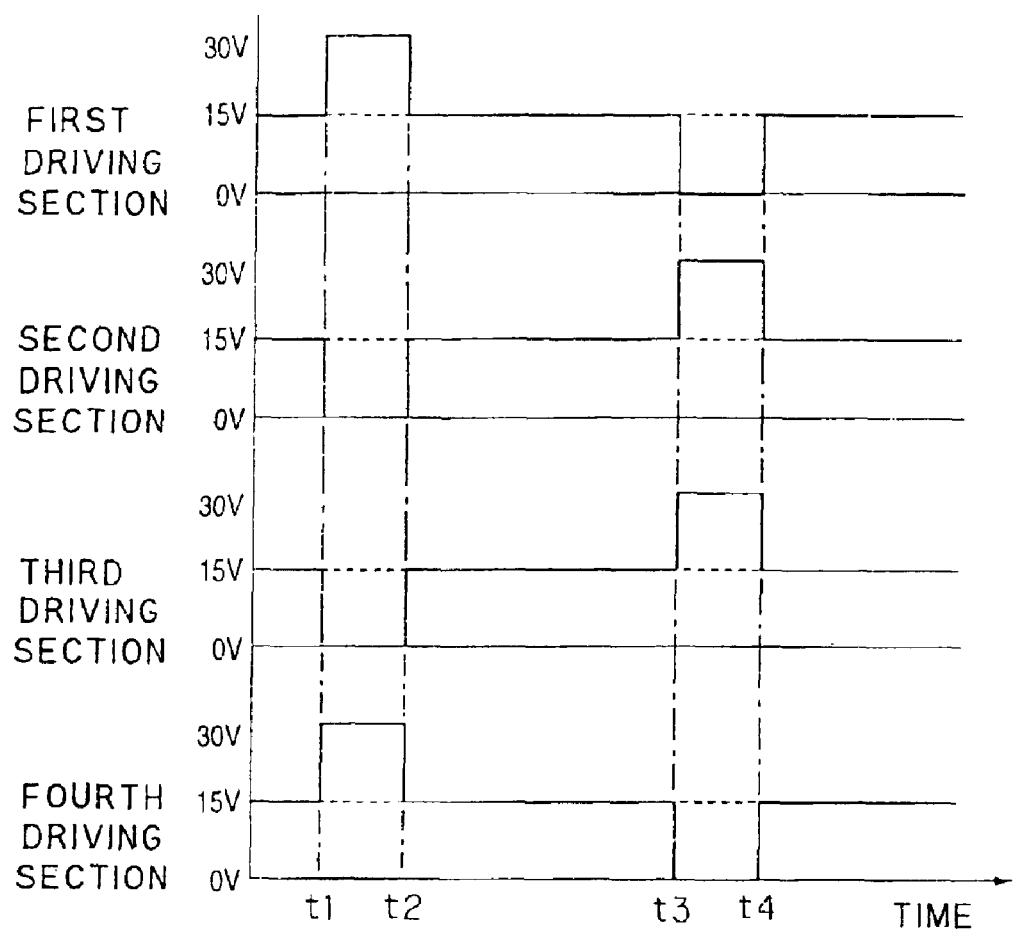
FIG. 6 is a graph showing one example of timing of applying a voltage to the piezoelectric actuator according to the first embodiment.

FIG. 6 is a graph showing one example of timing of applying a voltage to the piezoelectric actuator according to the first embodiment.

This graph shows a voltage applied between the common electrode layer and the separate electrode layer for each of the four driving sections. In the graph, the horizontal axis indicates the time and the vertical axis indicates the applied voltage.

In a period from t1 to t2, a voltage of 30 V is applied to the first and fourth driving sections, and no voltage is applied to the second and third driving sections. In a period from t3 to t4, a voltage of 30 V is applied to the second and third driving sections, and no voltage is applied to the first and fourth driving sections. This causes the piezoelectric actuator 110 to rotationally drive the slider 104 as shown in FIG. 5.

In the remaining period, a voltage of 15 V is applied to all the four driving sections, and thus, the four driving sections tend to shrink by an equal force. As a result, the slider 104 is forced to remain in a position (a home position) shown in FIG. 4. Applying the same voltage to all the four driving sections to keep the slider at the home position is not essential in the present invention, and no voltage may be simply applied to all the driving sections. Furthermore, the voltages may be applied to the respective pairs of driving sections located along the different diagonal lines at inverted timings of those shown in the graph, or at timings shifted from each other. Furthermore, the applied voltage may be in the form of rectangular pulses as shown in the graph, or vary smoothly.

Now, a result of analysis of performance of the first embodiment described above by the finite element method (FEM) will be described.

Even with the piezoelectric actuator having a length of 1.25 mm, a width of 0.12 mm and a thickness of 0.08 mm (four piezoelectric layers each having a thickness of 20 $\mu$m), applying a low voltage of 30 V provided a large displacement of 0.5 $\mu$m of the magnetic head on the slider. A high resonance frequency of 15.6 kHz was provided for the piezoelectric actuator having the slider secured thereto, and it was proved that high speed driving is possible. To provide an information storage device capable of reading/writing information at a high rate with a high recording density, the piezoelectric actuator is required to provide a displacement on the order of about 0.5 $\mu$m at an applied voltage of 30 V or less and have a resonance frequency of 10 kHz or higher. The result of analysis of the first embodiment described above adequately meets the requirements. When the piezoelectric actuator having the above-described dimensions was actually prototyped and the driving speed thereof was measured using a laser Doppler velocimeter while applying a periodic voltage, the above-described resonance frequency was observed. The information storage device which incorporates the piezoelectric actuator according to the first embodiment can read/write information at a high rate with a high recording density of 20 Gbit/in$^2$ or higher.

Up to this point, the first embodiment has been described. Now, other embodiments of the present invention will be described. Since the arrangement shown in FIG. 1 is common to the embodiments described later as described above, overlapping descriptions will be avoided hereinafter.

Figure 7:
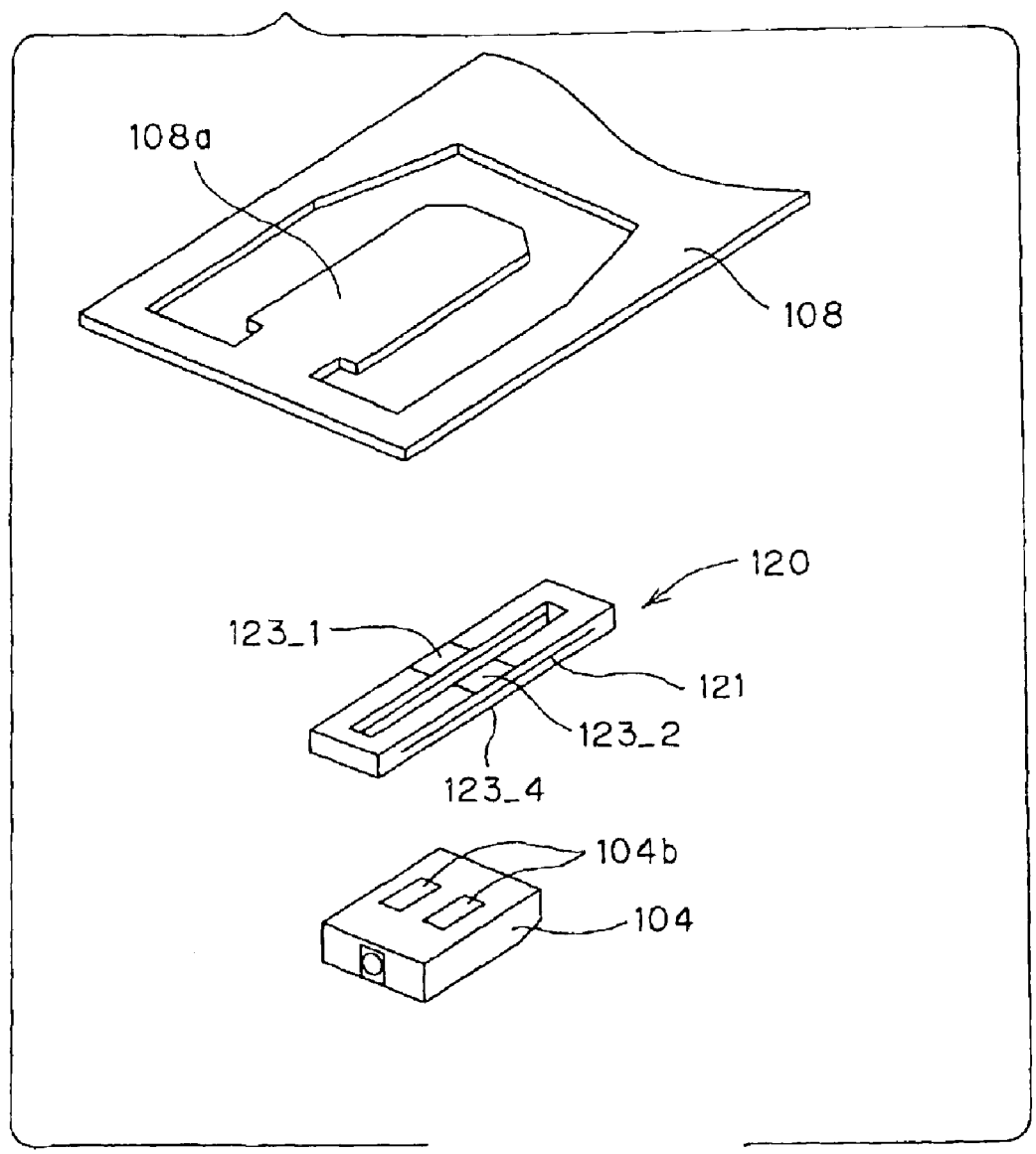
FIG. 7 is an exploded perspective view showing the tip end of the suspension and its peripheral components of the information recording device according to a second embodiment.
Figure 8:
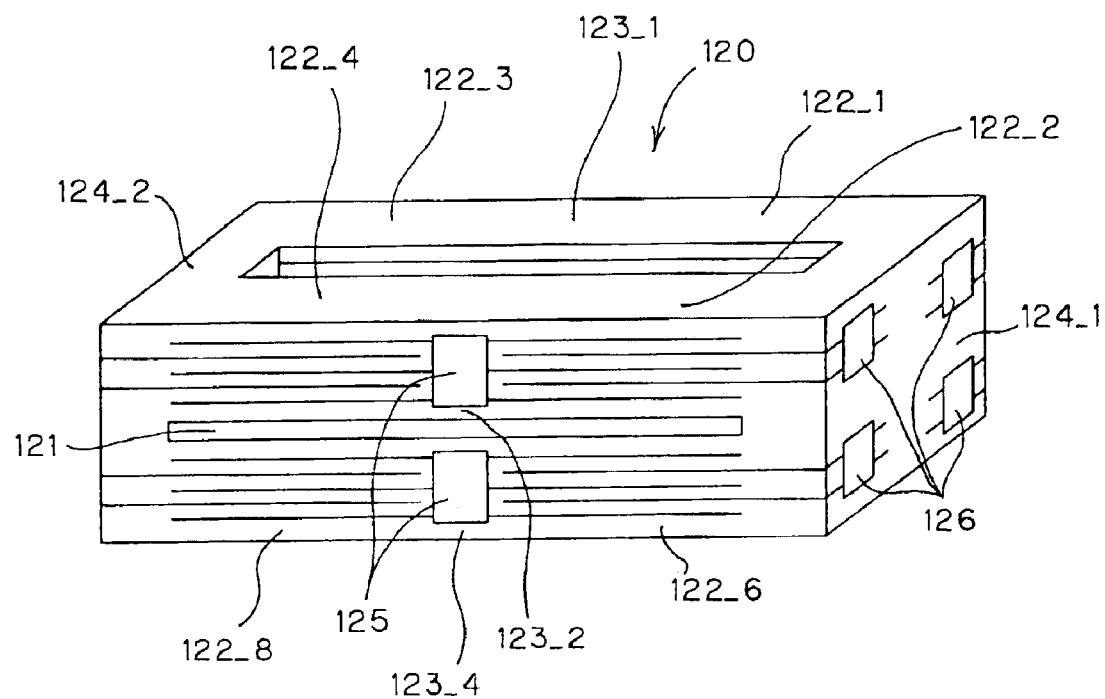
FIG. 8 is a perspective view showing the piezoelectric actuator according to the second embodiment of the present invention.

FIG. 7 is an exploded perspective view showing the tip end of the suspension and its peripheral components of the information recording device according to a second embodiment of the present invention, and FIG. 8 is a perspective view showing the piezoelectric actuator according to the second embodiment of the present invention.

The suspension 108 and the slider 104 shown in FIG. 7 are the same as the suspension 108 and the slider 104 shown in FIG. 2.

A piezoelectric actuator 120 shown in FIGS. 7 and 8 has a structure in which two driving stages are stacked, each of the driving stages having the same components as those of the piezoelectric actuator 110 shown in FIG. 2, and a slit 121 is provided between the driving stages. Since there are two driving stages, the piezoelectric actuator 120 has eight driving sections 122_1, . . . , 122_8, four central sections 123_1, . . . , 123_4 and two end sections 124_1, 124_2, the end sections 124_1 and 124_2 each being equivalent to two stacked end sections 113_1 and two stacked end sections 113_2 shown in FIG. 2, respectively. In addition, common electrode terminals 125 and separate electrode terminals 126 are provided on side surfaces of the piezoelectric actuator 120. The voltage is applied to the eight driving sections 122_1, . . . , 122_8 via the common electrode terminals 125 and the separate electrode terminals 126.

Of the four central sections 123_1, . . . , 123_4, the central sections 123_1 and 123_2 located toward the suspension 108 (in the upper stage) are secured to the holder section 108a of the suspension 108, and the central sections 123_3 (not shown) and 123_4 located toward the slider 104 (in the lower stage) are secured to the securing sections 104b of the slider 104.

Figure 9:
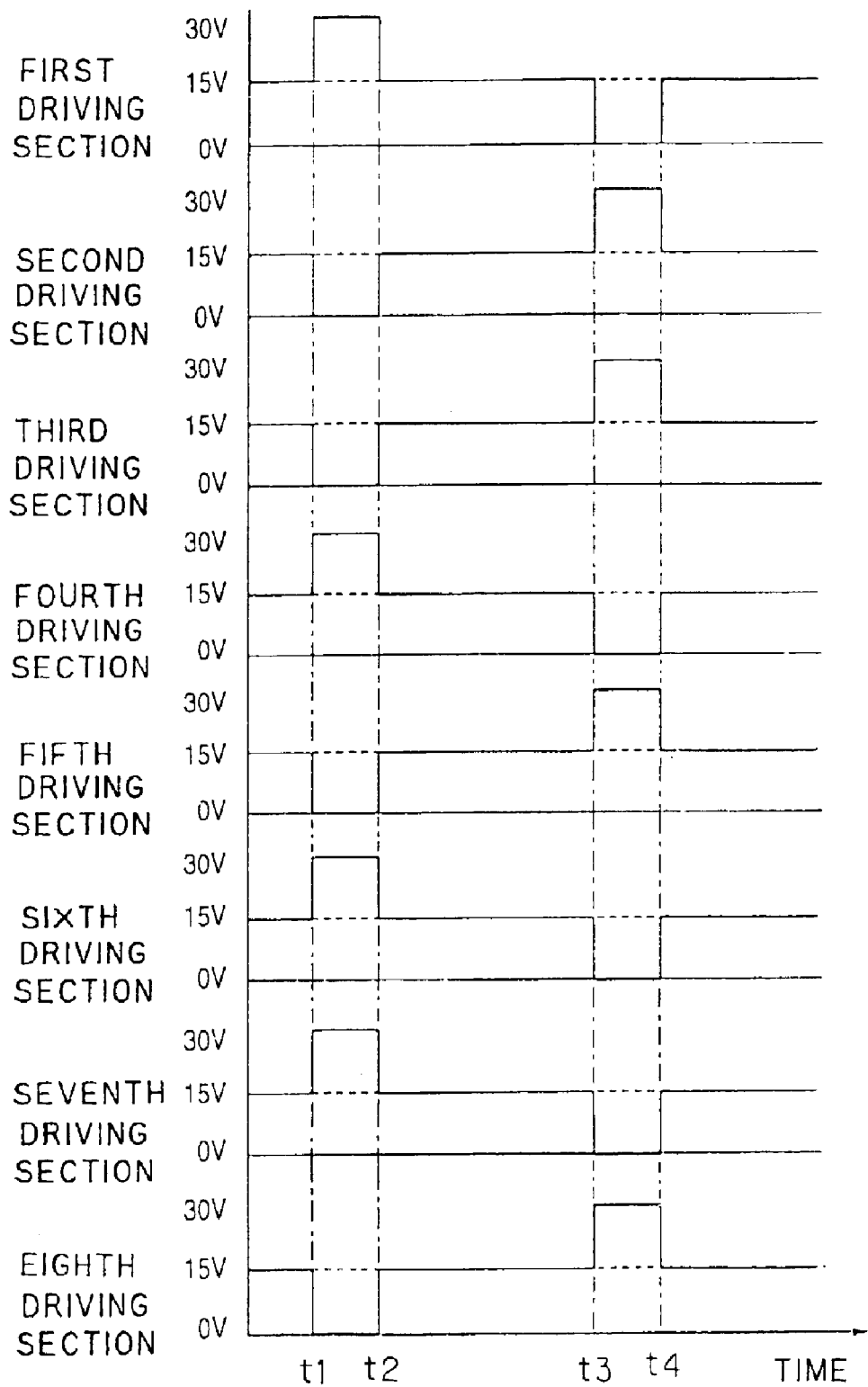
FIG. 9 is a graph showing one example of timing of applying a voltage to the piezoelectric actuator according to the second embodiment.
Figure 10:
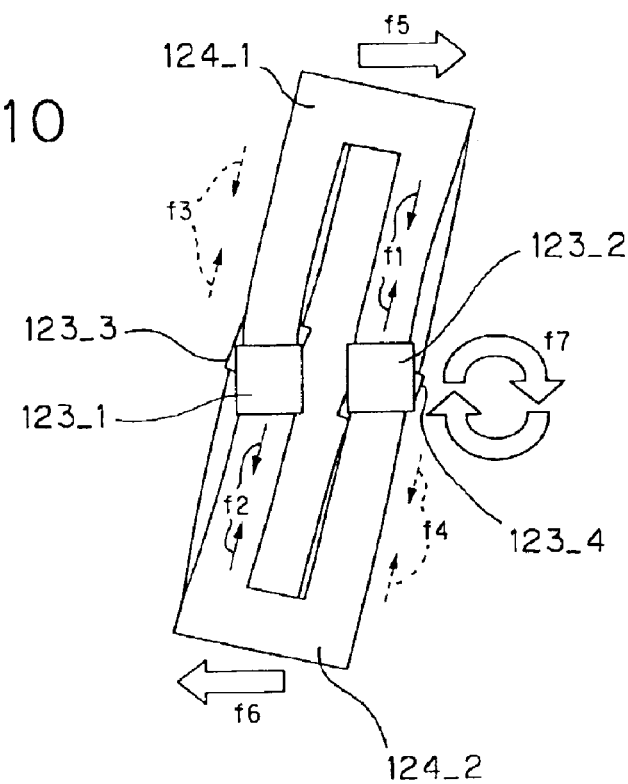
FIG. 10 illustrates a principle of driving the piezoelectric actuator according to the second embodiment.

FIG. 9 is a graph showing one example of timing of applying a voltage to the piezoelectric actuator according to the second embodiment. FIG. 10 illustrates a principle of driving the piezoelectric actuator according to the second embodiment.

This graph shows a voltage applied to each of the eight driving sections. In the graph, the horizontal axis indicates the time and the vertical axis indicates the applied voltage.

In a period from t1 to t2, a voltage of 30 V is applied to the first, fourth, sixth and seventh driving sections, and no voltage is applied to the second, third, fifth and eighth driving sections. In a period from t3 to t4, a voltage of 30 V is applied to the second, third, fifth and eighth driving sections, and no voltage is applied to the first, fourth, sixth and seventh driving sections. Specifically, the voltage is applied to the two driving sections, which are located along one diagonal line, of the four driving sections in the upper stage (first to fourth driving sections), and at the same time, the voltage is also applied to the two driving sections, which are located along the other diagonal line, of the four driving sections in the lower stage (fifth to eighth driving sections). This causes the two driving sections (second and third driving sections, for example) in the upper stage to be shrunk as indicated by arrows f1 and f2 in FIG. 10 and the two driving sections (fifth and eighth driving sections, for example) in the lower stage to be shrunk as indicated by arrows f3 and f4 in FIG. 10. As a result, the central sections in the upper and lower stages are rotationally driven relative to the pair of end sections 124_1 and 124_2 in the opposite directions. If the two central sections 123_1 and 123_2 in the upper stage are fixed, the two end sections 124_1 and 124_2 stage are rotationally driven as indicated by arrows f5 and f6, respectively, and the two central sections 123_3 and 123_4 in the lower stage are rotationally driven as indicated by an arrow f7. That is, the amount of rotation of the two central sections 123_3 and 123_4 in the lower stage relative to the two central sections 123_1 and 123_2 in the upper stage is about twice as much as the amount of rotation provided by a single driving stage. The amount of rotation of the central sections is increased with the increasing number of the stacked driving stages.

In the remaining period in FIG. 9, that is, in a period excluding the period from t1 to t2 and the period from t3 to t4, a voltage of 15 V is applied to all the eight driving-sections to force the slider to remain in the home position.

Now, a result of analysis of performance of the second embodiment by the FEM will be described.

With the piezoelectric actuator having a length of 1.25 mm, a width of 0.3 mm and a thickness of 0.16 mm (two stages of four piezoelectric layers each having a thickness of 20 µm), applying a low voltage of 30 V provided a large displacement of 0.51 µm of the magnetic head on the slider. A high resonance frequency of 24.7 kHz was provided for the piezoelectric actuator having the slider secured thereto. That is, according to the second embodiment, a piezoelectric actuator wider than the piezoelectric actuator according to the first embodiment can provide a displacement equivalent to that provided in the first embodiment due to the stacked two driving stages. Furthermore, it is proved that, in such a case, the resonance frequency can be raised in accordance with the increase in width.

Figure 11:
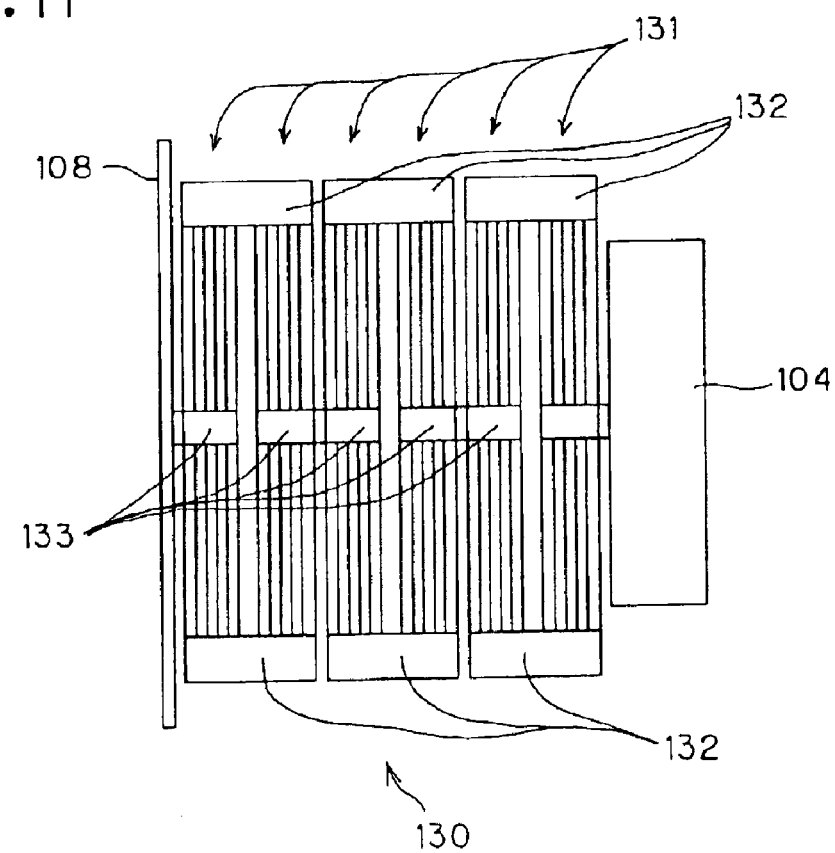
FIG. 11 shows a third embodiment of the present invention.

FIG. 11 shows a third embodiment of the present invention.

Also in the third embodiment, the suspension 108 and the slider 104 are the same as the suspension 108 and the slider 104 shown in FIG. 2.

A piezoelectric actuator 130 shown in FIG. 11 has a structure in which six driving stages 131 are stacked, each of the driving stages having the same components as those of the piezoelectric actuator shown in FIG. 2. The driving stages 131 are connected to each other at end sections 132 or central sections 133. Connection at the end sections 132 and connection at the central sections 133 occur alternately. That is, the 2N–1-th stage and the 2N-th stage are connected to each other at the end sections 132, and the 2N-th stage and the 2N+1-th stage are connected to each other at the central sections 133 (character N denotes an integer).

The central sections 133 of each driving stage 131 are rotationally driven relative to the end sections 132 according to the principle illustrated in FIG. 5. In addition, rotation driving directions in the driving stages 131 are alternately reversed. Thus, according to the principle illustrated in FIG. 10, the amount of rotation of the central sections is increased six times as much as that provided by a single driving stage.

In the following, a method for producing the piezoelectric actuator according to the second embodiment, as a representative of the piezoelectric actuators according to the first to third embodiment, will be described. As one example of production method, a so-called green sheet method is adopted herein.

Figure 12:
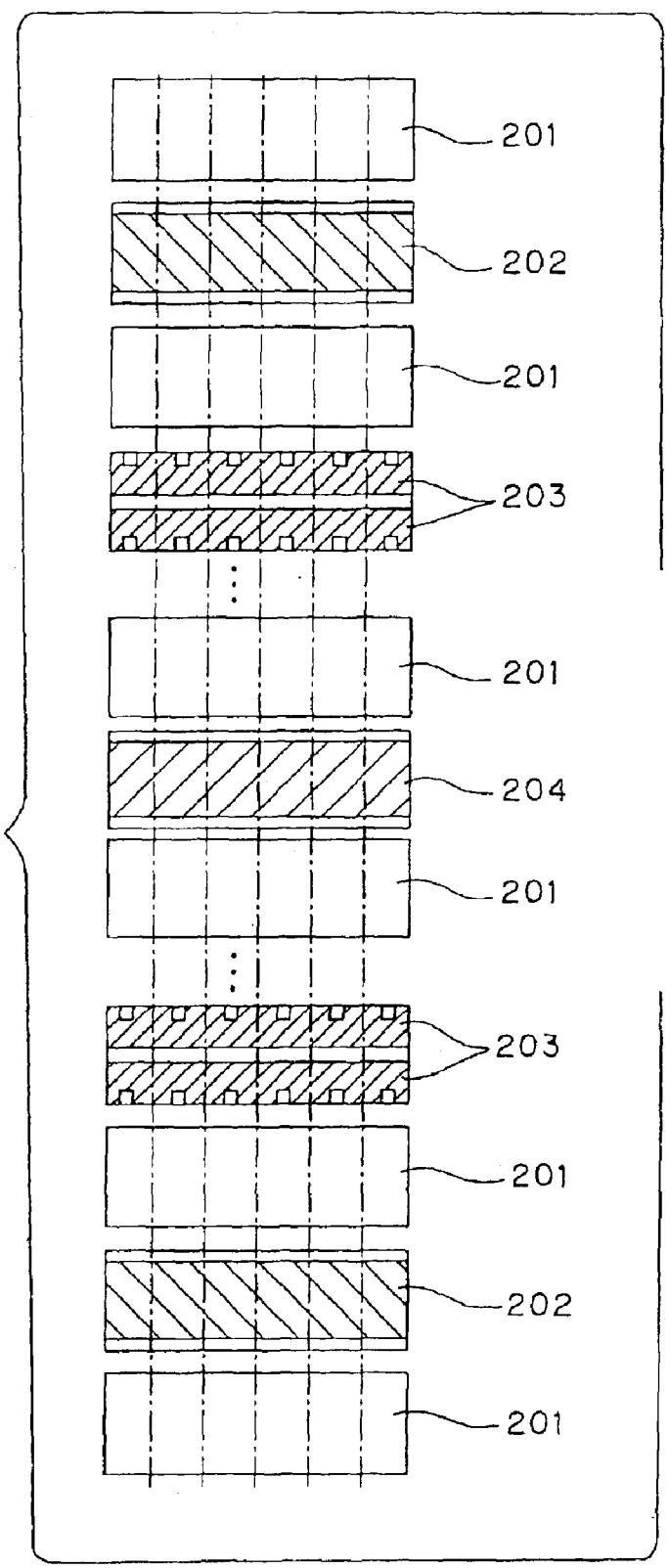
FIG. 12 illustrates the first half of a method for producing the piezoelectric actuator.

FIG. 12 illustrates the first half of the method for producing the piezoelectric actuator.

Here, layers described below are stacked to form a multilayer structure. Here, a process of producing six piezoelectric actuators at the same time is shown, and each of columns separated by alternate long and short dash lines in FIG. 12 corresponds to one piezoelectric actuator.

First, a green sheet 201 made of a piezoelectric material is formed, and a common electrode layer 202 made of a conductive material is screen-printed on the green sheet 201. The piezoelectric material may be a PZT-based material, PT-based material, barium-titanate-based material or layered-perovskite-based material. The conductive material may be an Ag—Pd paste or Pt paste.

Then, another green sheet 201 is formed on the common electrode layer 202, and a separate electrode layer 203 made of a conductive material, Pt, for example, is screen-printed on the green sheet 201. A desired number of green sheets 201, common electrode layers 202 and separate electrode layers 203 are repeatedly stacked to form one driving stage.

Then, a binder layer 204 is formed between the green sheets 201. The binder layer 204 constitutes a slit as described later.

Furthermore, in the same manner as described above, a desired number of green sheets 201, common electrode layers 202 and separate electrode layers 203 are repeatedly stacked.

Figure 13:
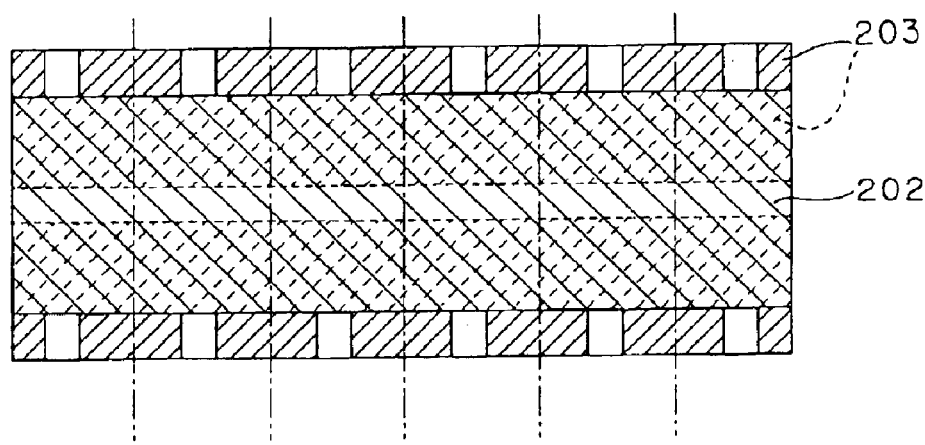
FIG. 13 shows a common electrode layer and a separate electrode layer overlaid one on the other.

FIG. 13 shows the common electrode layer and the separate electrode layer overlaid one on the other.

The common electrode layer 202 and the separate electrode layer 203 partially overlap one another, and the common electrode layer 202 interconnects two parts of the separate electrode layer 203.

Figure 14:
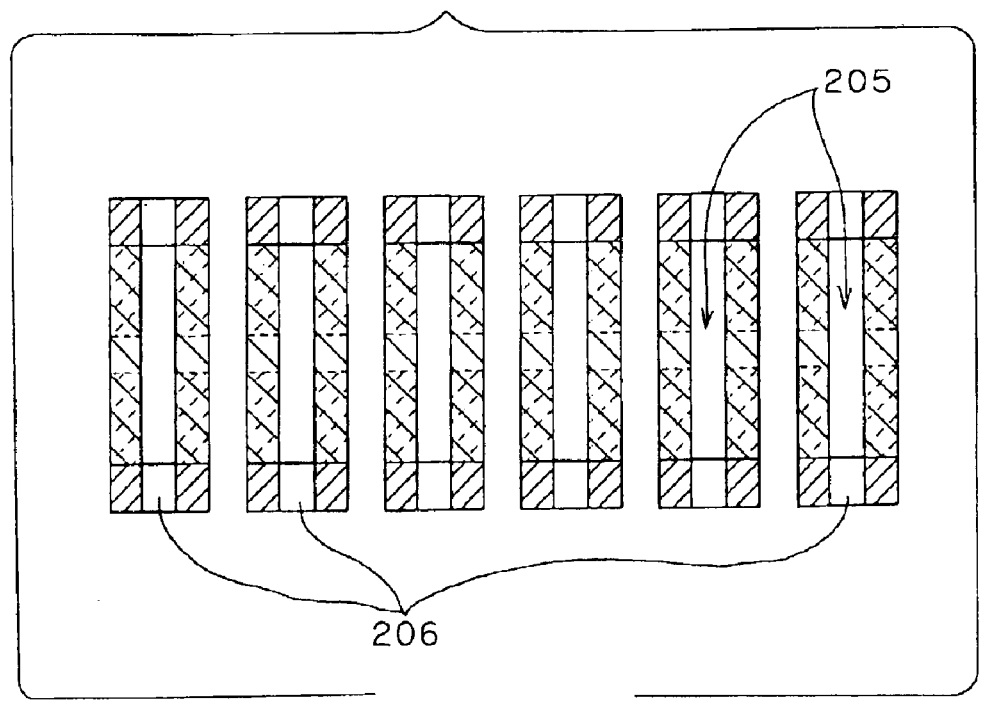
FIG. 14 illustrates the latter half of the method for producing a piezoelectric actuator.

FIG. 14 illustrates the latter half of the method for producing the piezoelectric actuator.

Holes 205 are formed by sandblasting in the stack body comprising the layers stacked as described with reference to FIGS. 12 and 13, and the stack body is burned in an atmosphere at 1050° C. This burning eliminates the binder layer described above, thereby providing the slit described above. The material constituting the binder layer may be a PVB binder or another binder that can be eliminated by burning. The burned stack body is divided into six semi-finished products 206 by the alternate long and short dash lines shown in FIGS. 12 and 13. As shown in FIG. 8, the common electrode terminal 125 and the separate electrode terminal 126 are provided on each semi-finished product 206.

The piezoelectric actuators according to the embodiments described above are produced in such a process.

Figure 15:
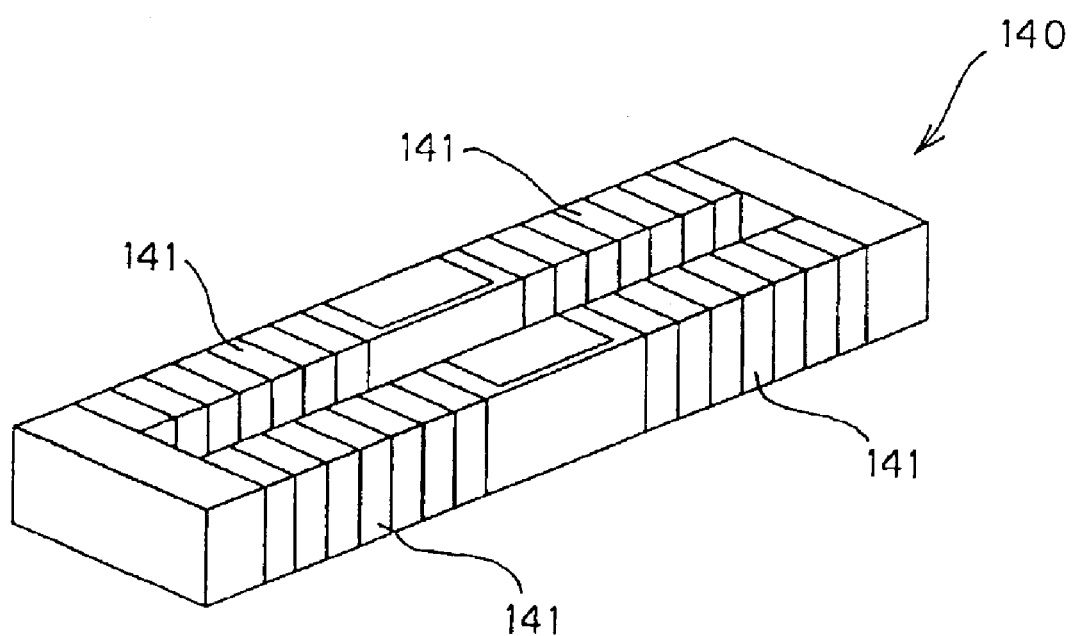
FIG. 15 shows the piezoelectric actuator according to a fourth embodiment of the present invention.

FIG. 15 shows the piezoelectric actuator according to a fourth embodiment of the present invention.

As in the case of the piezoelectric actuator 110 according to the first embodiment shown in FIG. 3, a piezoelectric actuator 140 according to the fourth embodiment of the present invention shown in FIG. 15 has four rod-shaped driving sections 141. Each of the four driving sections 141 comprises the piezoelectric layers and electrode layers stacked along the length of the driving section, and if a voltage is applied between the electrodes, the driving section is elongated due to the piezoelectric longitudinal effect (33 mode).

Replacing the piezoelectric actuator according to the first embodiment with the piezoelectric actuator 140 according to the fourth embodiment enables the slider to be rotationally driven as described above.

The piezoelectric actuators based on the piezoelectric transverse effect (31 mode) have an advantage of being easily produced, and the piezoelectric actuators based on the piezoelectric longitudinal effect (33 mode) have an advantage of providing a large amount of rotation.

Figure 16:
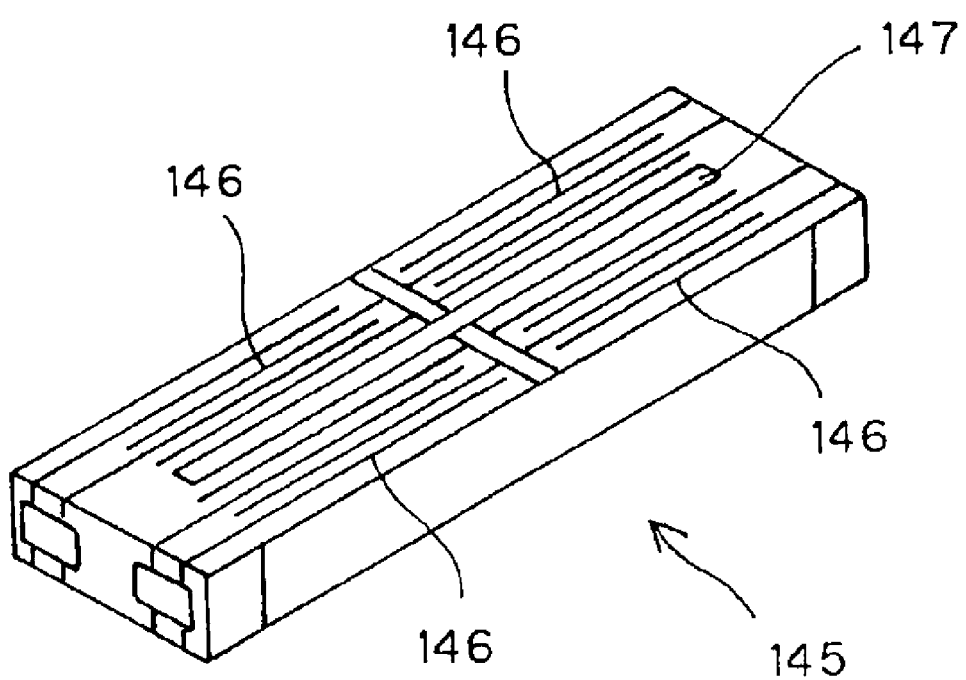
FIG. 16 shows the piezoelectric actuator according to a fifth embodiment of the present invention.

FIG. 16 shows the piezoelectric actuator according to a fifth embodiment of the present invention.

As in the case of the piezoelectric actuator 110 according to the first embodiment shown in FIG. 3, a piezoelectric actuator 145 according to the fifth embodiment shown in FIG. 16 has four rod-shaped driving sections 146. The piezoelectric layers and electrode layers are stacked in each of the four driving sections 146 in a direction perpendicular to the longitudinal direction of the driving section 146 and also perpendicular to the direction in which the layers would be stacked in the piezoelectric actuator 110 according to the first embodiment.

If the layers are stacked in such a direction, a structure of the piezoelectric actuator 145 having a hole 147 at the center can be provided using the binder layer described above, and the piezoelectric actuator 145 can be quite easily produced.

Figure 17:
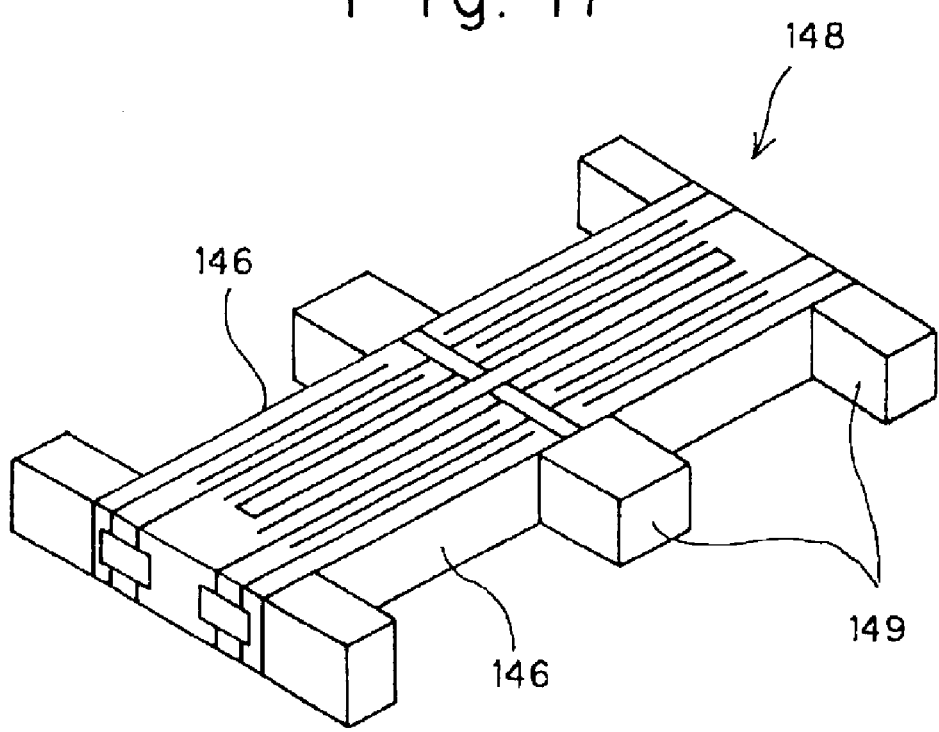
FIG. 17 shows the piezoelectric actuator according to a sixth embodiment of the present invention.

FIG. 17 shows the piezoelectric actuator according to a sixth embodiment of the present invention.

A piezoelectric actuator 148 according to the sixth embodiment is the same as the piezoelectric actuator 145 according to the fifth embodiment shown in FIG. 16 except that it has six projections 149.

In order for the piezoelectric actuator to rotationally drive the slider or the like according to the driving principle described with reference to FIG. 5, it is essential that the four rod-shaped driving sections 146 are sufficiently narrow and flexible. In addition, in order to provide a sufficient amount of rotation, it is essential that the driving sections 146 in parallel with each other are disposed sufficiently close to each other.

However, if an object to be driven, such as the suspension 108 and slider 104 shown in FIG. 2, is secured to the narrow piezoelectric actuator 145 shown in FIG. 16, the object can possibly be tilted when being secured thereto.

Thus, the piezoelectric actuator 148 according to the sixth embodiment has the projections 149 extending in a direction in which the rod-shaped driving sections 146 are disposed side by side, and the projections 149 prevent the object from being tilted. Furthermore, since the projections 149 are provided at areas other than the side surfaces of the driving sections 146, the driving sections 146 can be shrunk or elongated freely.

A method for producing the piezoelectric actuator 148 having such projections 149 will be described below.

Figure 18:
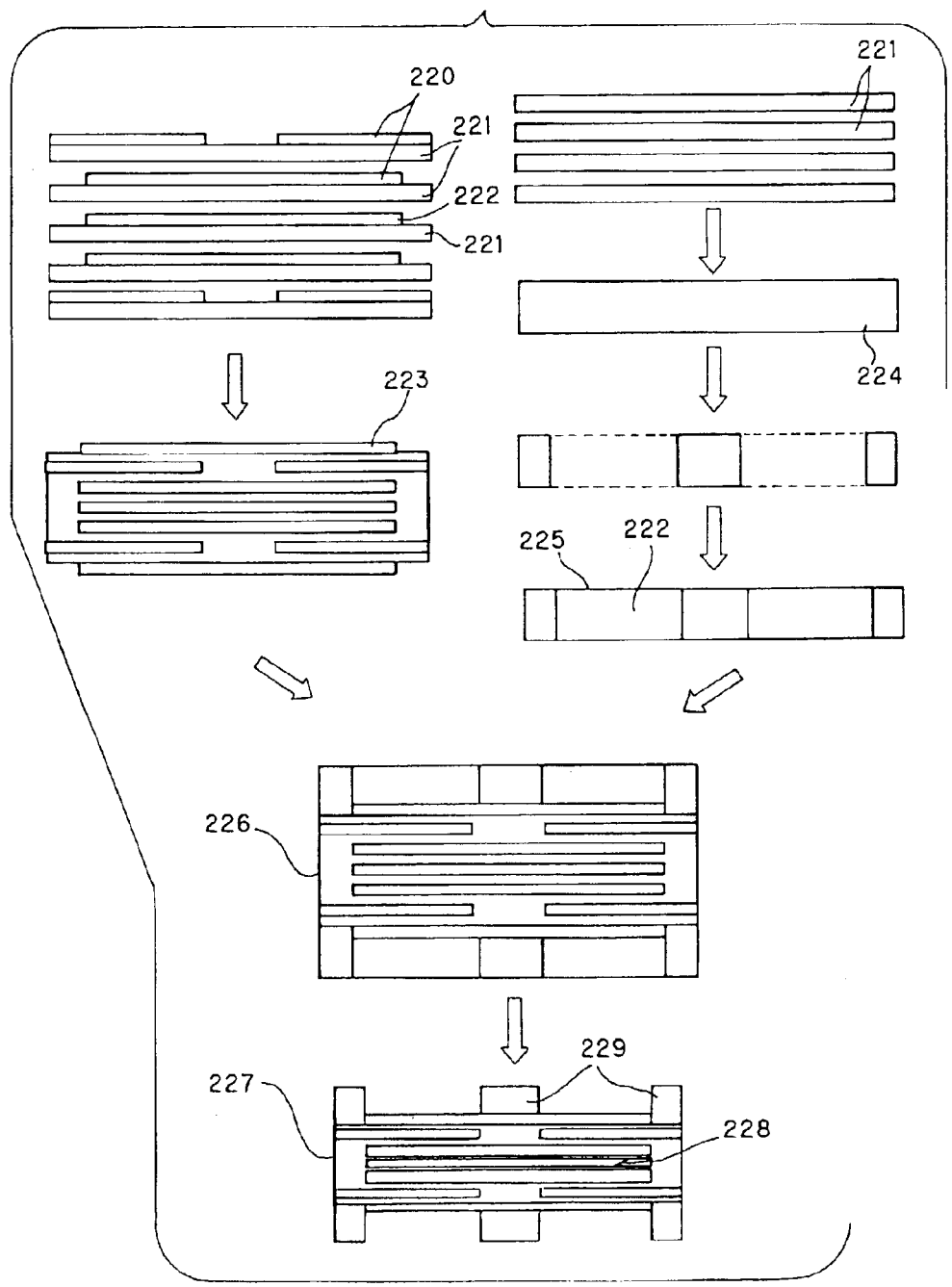
FIG. 18 illustrates the first half of a first method for producing a piezoelectric actuator having projections provided thereon.
Figure 19:
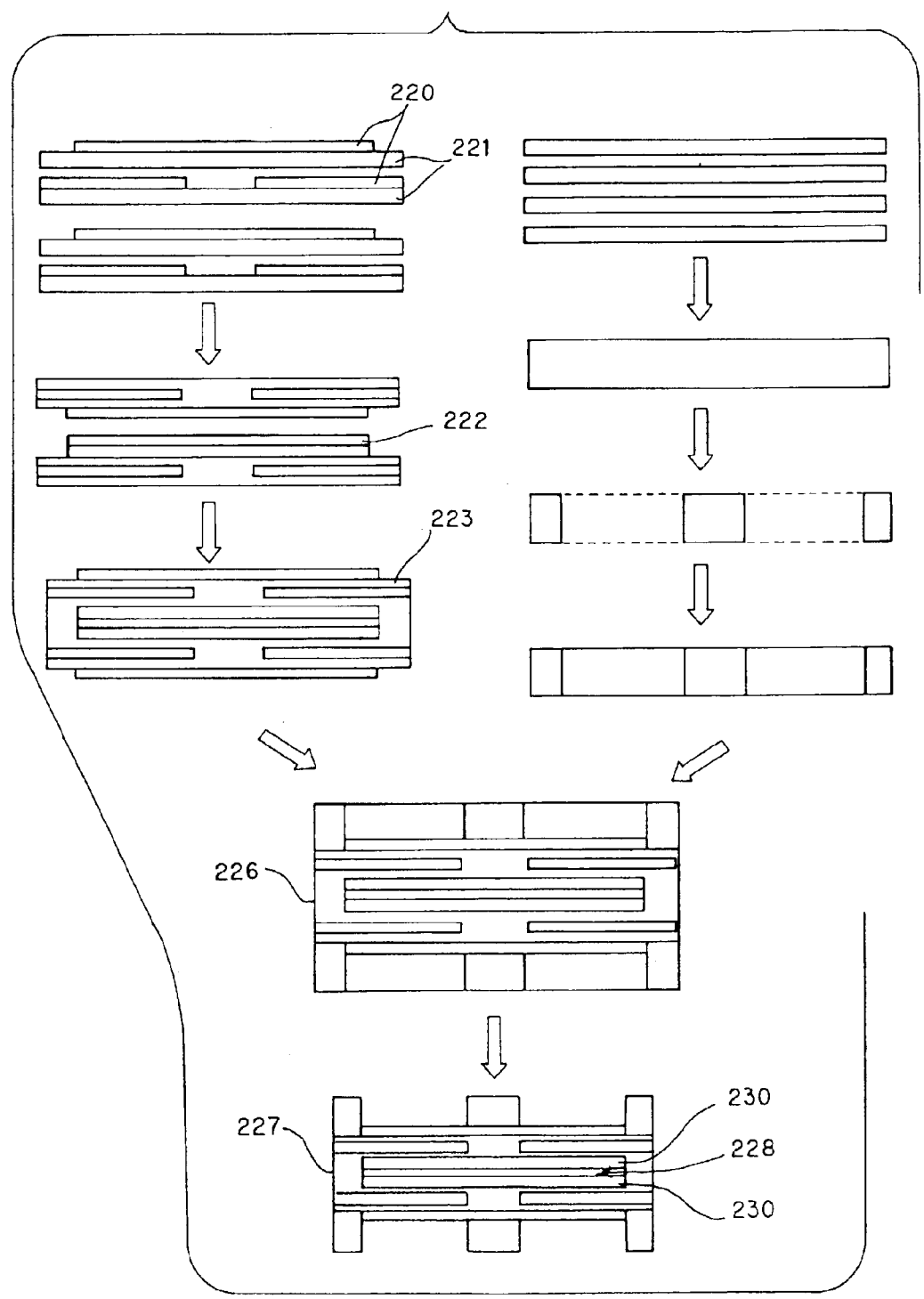
FIG. 19 illustrates the first half of a second method for producing a piezoelectric actuator having projections provided thereon.

FIG. 18 illustrates the first half of a first method for producing the piezoelectric actuator having the projections. FIG. 19 illustrates the first half of a second method for producing the piezoelectric actuator.

The first and second methods provide generally the same piezoelectric actuators.

According to the first production method illustrated in FIG. 18, a required number of green sheets 221 are stacked, each of the green sheets 221 having a conductive material 220 with a pattern of an electrode layer printed thereon, and each of the green sheets 221 having a binder 222 applied thereto, and then the stack is compressed at a low pressure to provide a first temporary stack body 223. Besides, a required number of green sheets are compressed to provide a thick plate 224, a hole is formed in the thick plate 224 at a predetermined position, and the hole is filled with the binder 222, thereby providing a second temporary stack body 225.

One first temporary stack body 223 and two second temporary stack bodies 225, thus formed, are stacked and compressed at a high pressure to provide a complete stack body 226. Then, the complete stack body is degreased and burned to provide a burned body 227. In the degreasing and burning, the binder 222 is eliminated and a slit 228 and projections 229 are formed.

According to the second production method illustrated in FIG. 19, two sets of a required number of stacked green sheets 221 are prepared, each of the green sheets 221 having a conductive material 220 with a pattern of an electrode layer printed thereon, and then the two sets are stacked with a binder 222 sandwiched therebetween to provide a first temporary stack body 223. A second temporary stack body is formed in the same manner as in the first production method described above.

Then, as in the first production method described above, one first temporary stack body 223 and two second temporary stack bodies 225 are stacked and compressed at a high pressure to provide a complete stack body 226, and the complete stack body 226 is degreased and burned to provide a burned body 227.

The burned body 227 provided in the second production method has a high durability since the side surfaces of the slit 228 are covered with electrode layers 230.

Figure 20:
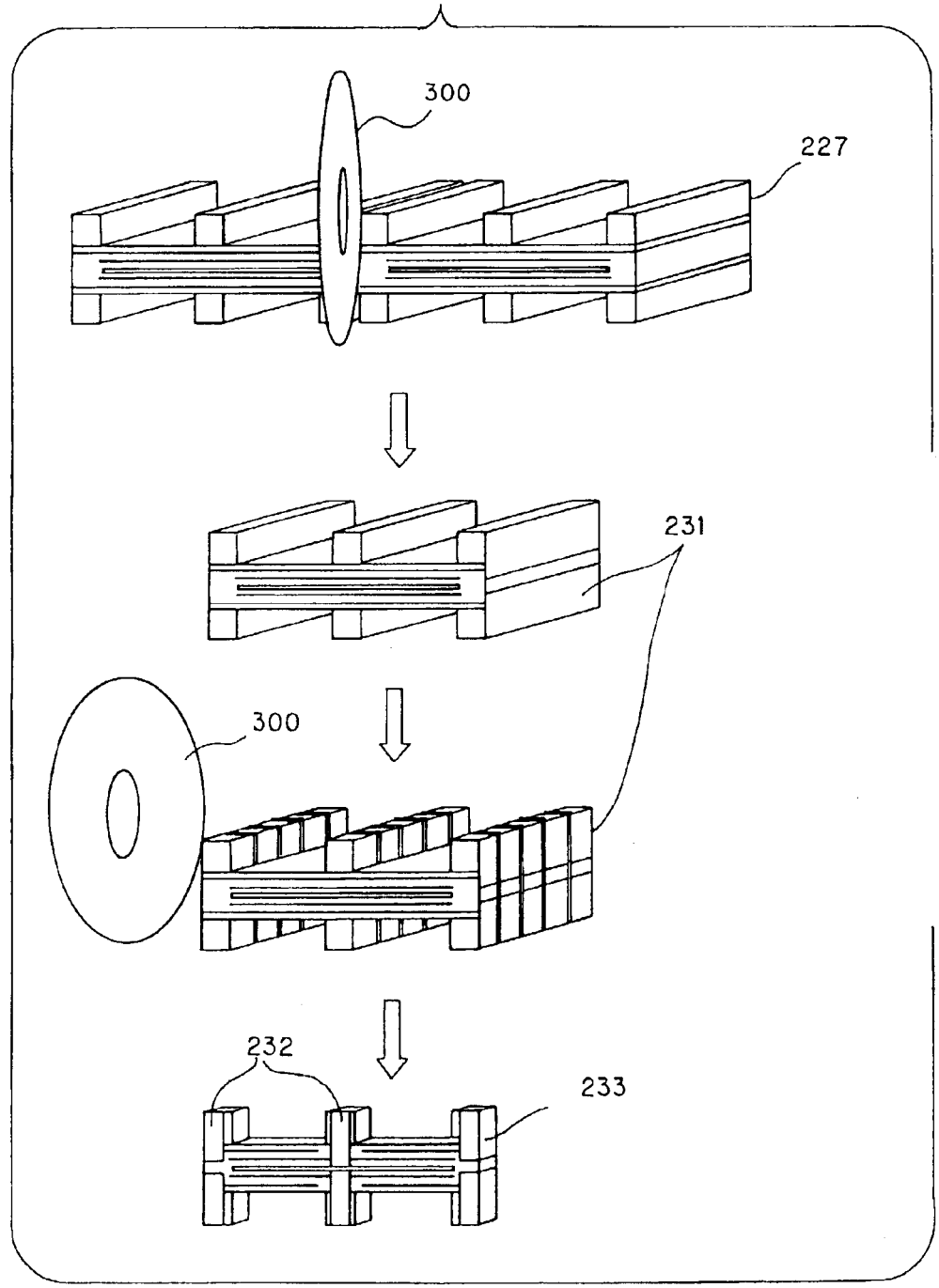
FIG. 20 illustrates the latter half of the first and second production methods.

FIG. 20 illustrates the latter half of the first and second production methods.

In general, the burned body 227 described above is provided in the form of an aggregate of a plurality of stack structures of piezoelectric actuators. The burned body 227 is cut by a saw 300 into intermediate bodies 231. Each intermediate body 231 is further cut by the saw 300, and a side electrode 232 or the like is formed by evaporation on a cut surface of the cut piece to provide a piezoelectric actuator complete product 233.

The means of interconnecting the electrode layers in the embodiments described above may be a via penetrating the piezoelectric layer.

Figure 21:
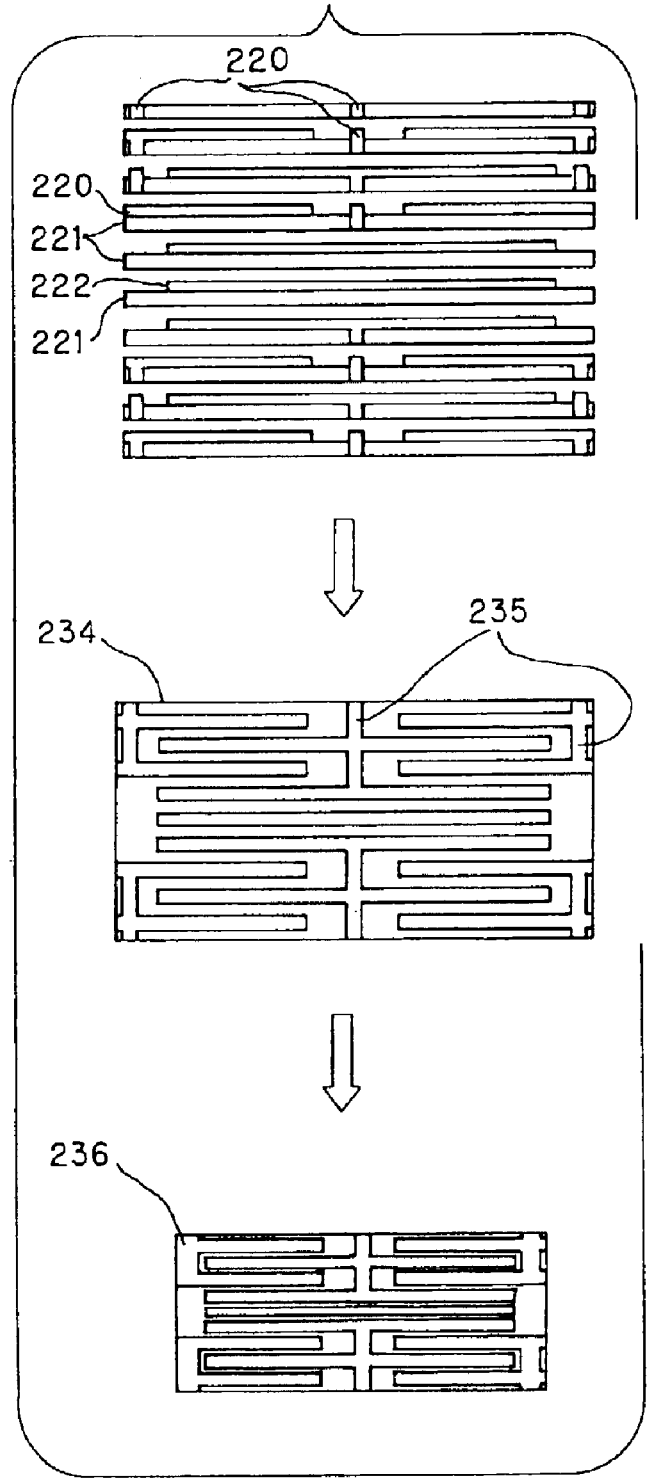
FIG. 21 illustrates the first half of a method for producing a piezoelectric actuator having electrode layers interconnected through a via.
Figure 22:
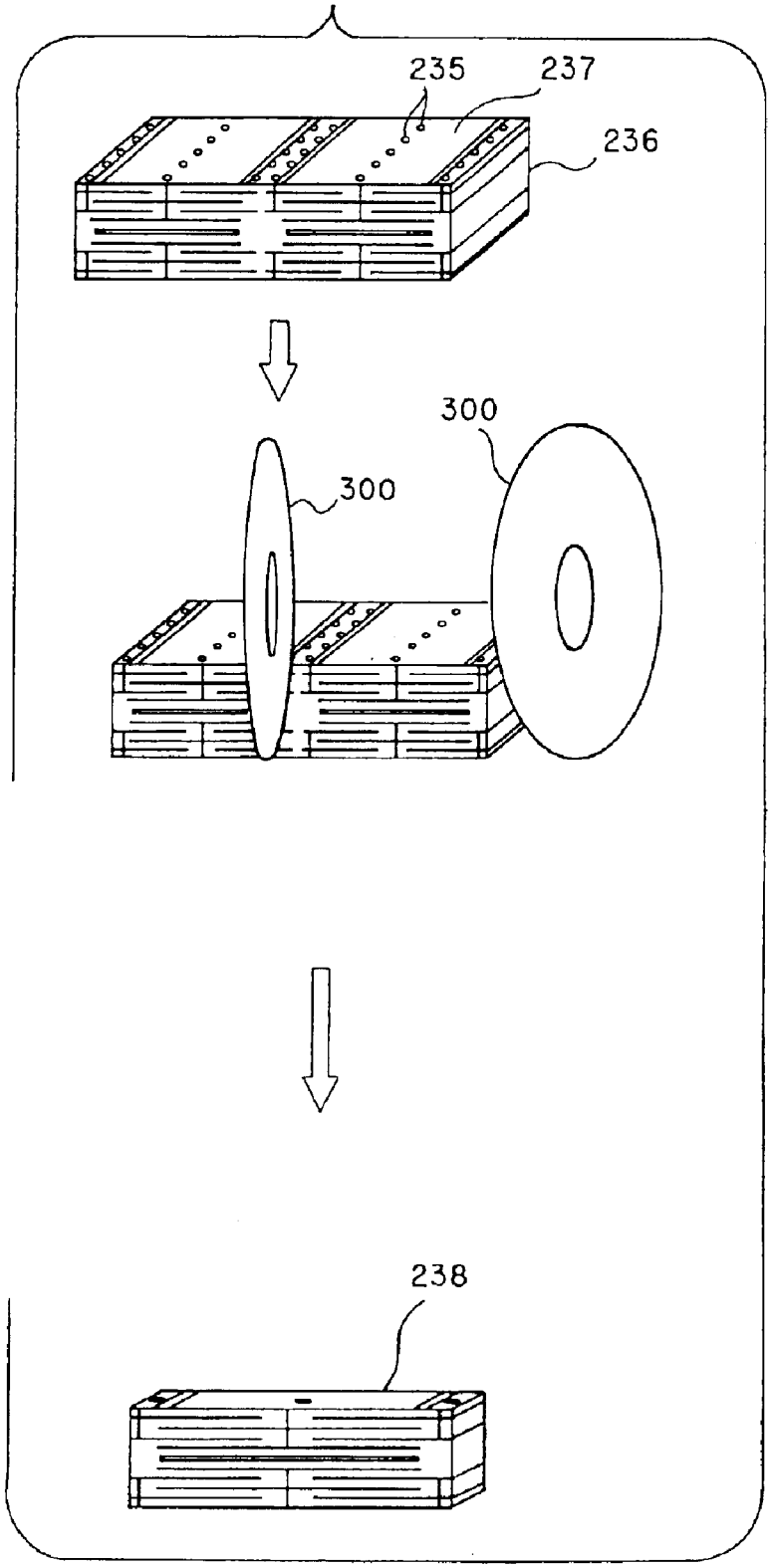
FIG. 22 illustrates the latter half of the method for producing a piezoelectric actuator having electrode layers interconnected through a via.

FIG. 21 illustrates the first half of a method for producing the piezoelectric actuator having electrode layers interconnected through a via. FIG. 22 illustrates the latter half of the production method.

FIGS. 21 and 22 illustrate the method for producing the piezoelectric actuator having the stack structure shown in FIG. 16 and having the electrode layers interconnected through a via. A piezoelectric actuator having a stack structure different from that shown in FIG. 16 and having the electrode layers interconnected through a via can also be produced by the same production method as shown in FIGS. 21 and 22.

According to the production method, as shown in FIG. 21, a required number of green sheets 221 each of the green sheets 221 having a conductive material 220 with a pattern of an electrode layer printed thereon and having a through hole formed at a predetermined position and filled with the conductive material 220, and green sheets 221 each of the green sheets 221 having a binder 222 applied thereto are stacked, and then compressed to provide a stack body 234. This compression causes the conductive material 220 filling the through hole in one green sheet to be coupled with the conductive material 220 of another green sheet, thereby forming a via 235. Then, the stack body 234 is degreased and burned to provide a burned body 236.

As shown in FIG. 22, an end face of the via 235 is exposed at a surface of the burned body 236, and an electrode 237 is formed on the surface by evaporation. This evaporation step needs to be performed only once on each burned body, and therefore, the number of evaporation steps required to form the electrode is reduced and the production cost is reduced compared with the case of providing the side electrode rather than the via.

Then, the burned body 236 having the electrode 237 formed by evaporation thereon is cut by the saw 300 to complete a piezoelectric actuator product 238.

Up to this point, a first type of embodiments has been described. Now, a second type of embodiments will be described.

Figure 23:
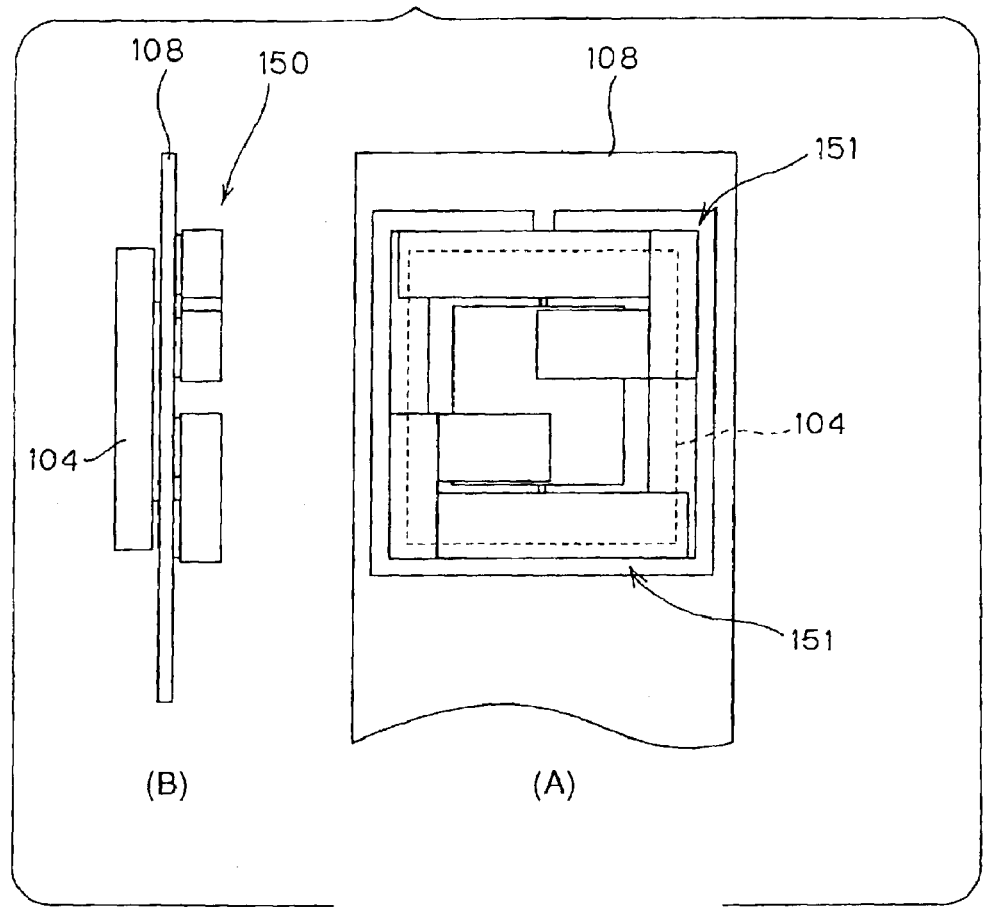
FIG. 23 shows the tip end of the suspension and its peripheral components according to a seventh embodiment of the present invention.

FIG. 23 shows a seventh first embodiment of the present invention.

FIG. 23(A) is a front view of the tip end of the suspension and its peripheral components, and FIG. 23(B) is a side view thereof.

In the seventh embodiment, a part of the suspension 108 serves also as a base of a piezoelectric actuator 150. The piezoelectric actuator 150 is located on one side of the plate-shaped suspension 108, and the slider 104 is located on the other side thereof.

The piezoelectric actuator 150 has two driving sections 151 disposed in rotational symmetry and line asymmetry. As described later, these two driving sections 151 rotationally drive the slider 104 about the center of gravity.

Figure 24:
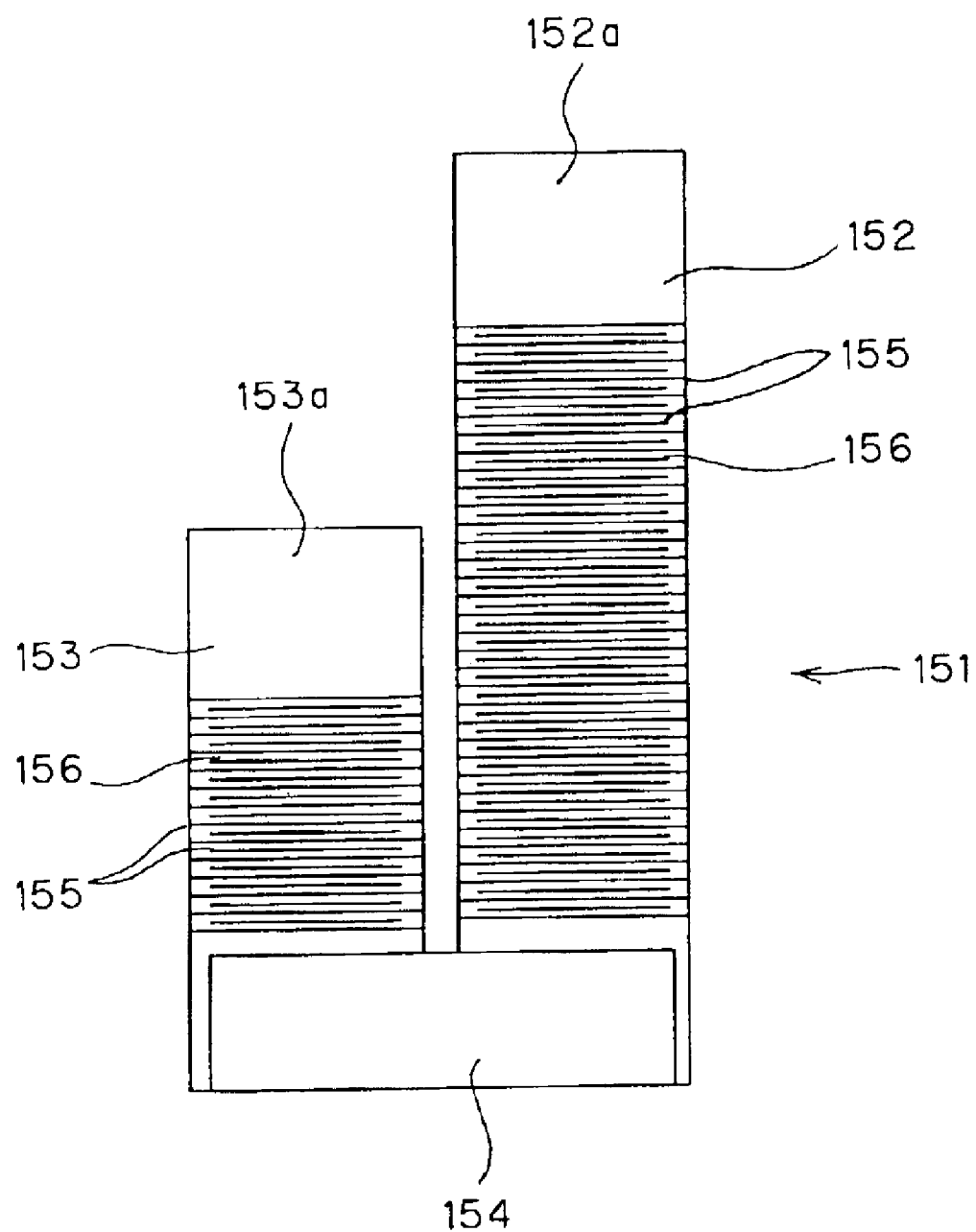
FIG. 24 shows an arrangement of a driving section according to the seventh embodiment.

FIG. 24 shows an arrangement of the driving section.

The driving section 151 comprises a rod-shaped first driving body 152, a rod-shaped second driving body 153 and a fixture 154 for fixing one end of each of the driving bodies 152, 153. The fixture 154 used here is a plate made of the same material as the suspension.

The first driving body 152 and the second driving body 153 are disposed in parallel with each other and each have a stack structure composed of electrode layers 155 and piezoelectric layers 156. The electrode layers 155 and the piezoelectric layers 156 are stacked along the length of the first driving body 152 and the second driving body 153. Each of the first driving body 152 and the second driving body 153 is elongated along the length thereof due to the piezoelectric longitudinal effect (33 mode) when a voltage is applied between adjacent electrode layers 155 with a piezoelectric layer 156 sandwiched therebetween. When the applied voltage is removed, each of the first driving body 152 and the second driving body 153 is shrunk along the length thereof. Here, it is assumed that the first driving body 152 comprises 33 layers and the second driving body 153 comprises 13 layers. Then, if one layer is 20 µm thick, the first driving body has a thickness of 660 µm, and the second driving body has a thickness of 260 µm, and if the applied voltage is 30 V, the first driving body is elongated by 564 nm and the second driving body is elongated by 222 nm. In this way, highly precise positioning on the order of several hundreds nanometers is possible. Here, of the ends of the first driving body 152, the end other than the one fixed to the fixture 154 constitutes a first driving end 152a, and of the ends of the second driving body, the end other than the one fixed to the fixture 154 constitutes a second driving end 153a. Elongation of the first driving body 152 and the second driving body 153 causes the second driving end 153a to be driven with respect to the first driving end 152a.

Figure 25:
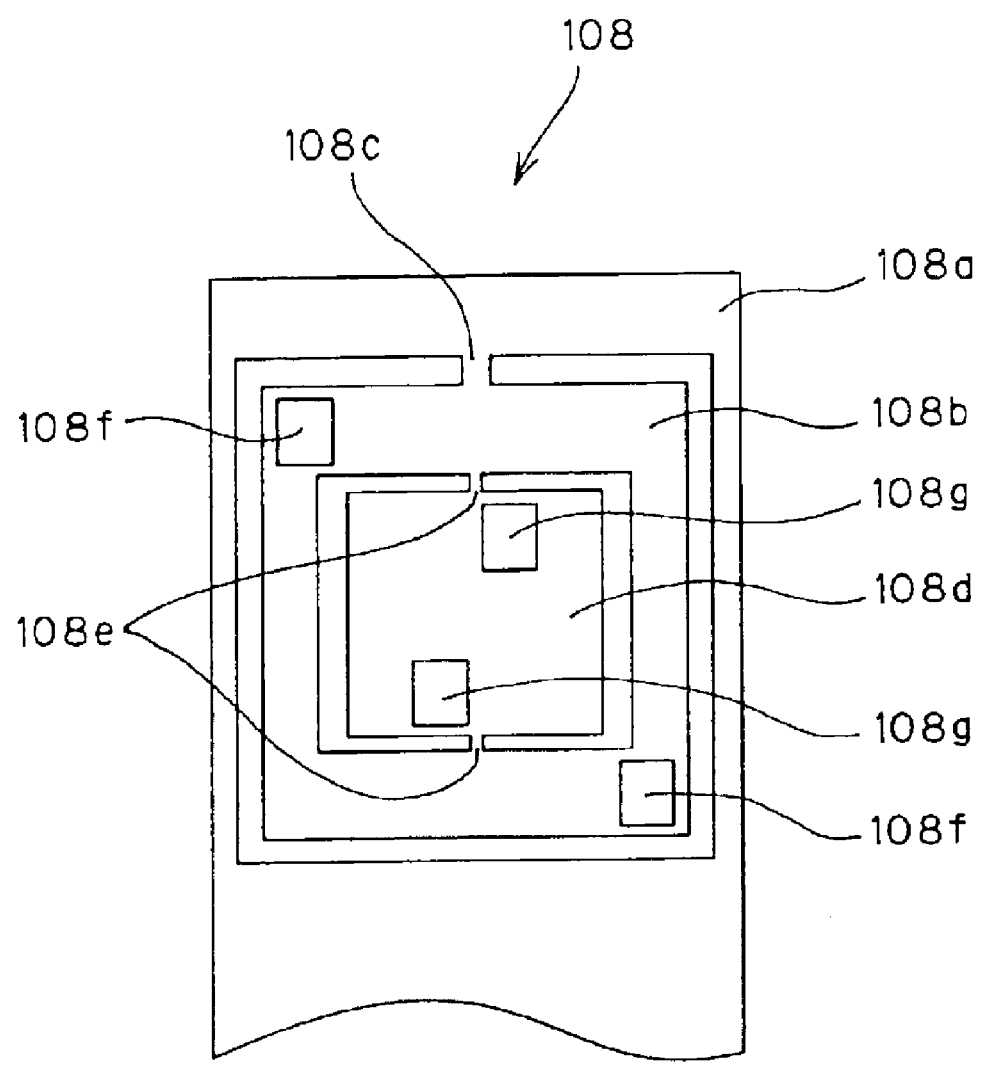
FIG. 25 shows an arrangement of the tip end of the suspension and its peripheral components.

FIG. 25 shows an arrangement of the tip end of the suspension and its peripheral components.

The suspension 108 comprises the main body 108a, the holder section 108b and a slider securing section 108d. The holder section 108b serves as a plate spring because it can be elastically deformed at a connection 108c to the main body 108a. The slider securing section 108d has the slider secured thereto and is rotatably held by the annular holder section 108b via two narrow line sections 108e. The holder section 108b serves also as the base of the piezoelectric actuator of the present invention, and the first driving end 152a of the driving section 151 shown in FIG. 24 is secured to a driving end securing section 108f of the holder section 108b. Besides, the second driving end 153a is secured to a driving end securing section 108g of the slider securing section 108d, whereby the second driving end 153a is fixed to the slider via the slider securing section 108d.

Now, description will continue referring back to FIG. 23.

The slider 104 is held directly by the suspension 108 and fixed to the two driving sections 151 via the slide securing section of the suspension 108. Thus, the weight of the slider 104 or a stress caused when the slider 104 moves toward or away from the magnetic disk is primarily accommodated by the tough suspension 108, and the brittle driving sections 151 are less loaded, so that the durability of the actuator is enhanced.

Besides, the slider 104 is driven integrally with the slider securing section by the two driving sections 151 secured to the suspension 108.

Figure 26:
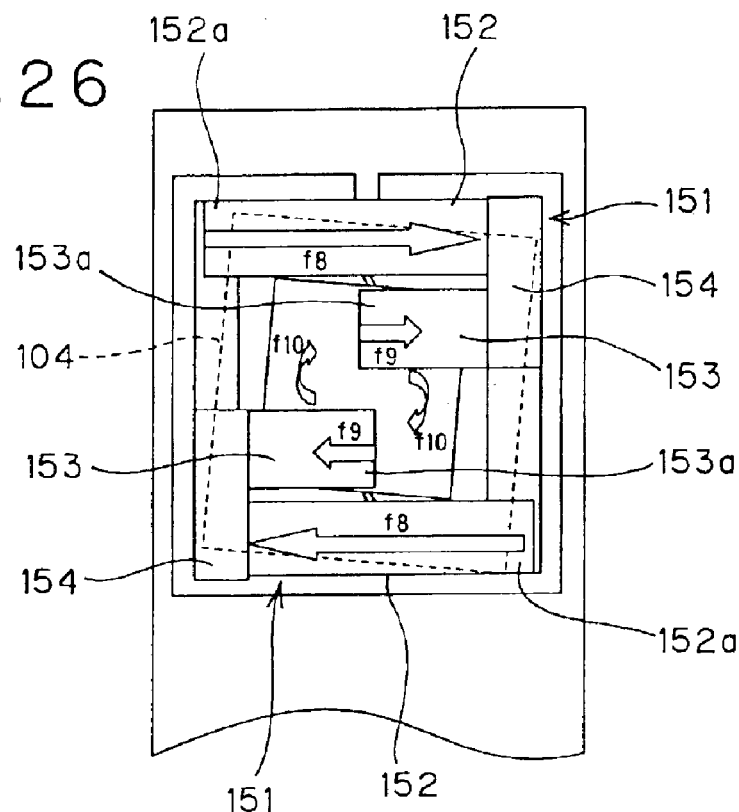
FIG. 26 shows a state where first driving bodies are elongated.
Figure 27:
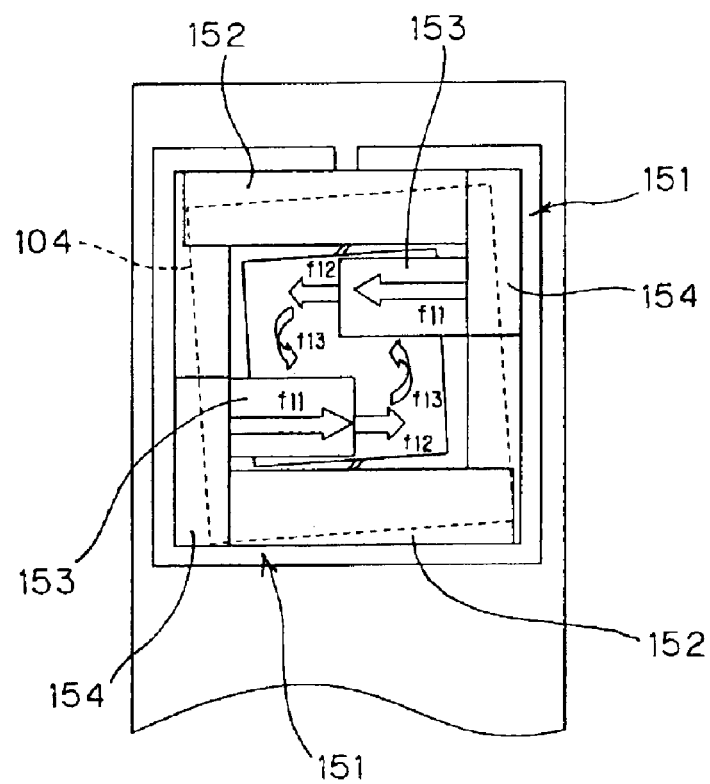
FIG. 27 shows a state where second driving bodies are elongated.

FIGS. 26 and 27 illustrate a driving principle according to the seventh embodiment.

FIG. 26 shows a state where a voltage is applied to each of the first driving bodies 152 of the two driving sections 151, whereby the first driving bodies 152 are elongated. FIG. 27 shows a state where a voltage is applied to each of the second driving bodies 153 of the two driving sections 151, whereby the second driving bodies 153 are elongated.

Since the first driving end 152a is fixed to the suspension 108, when the voltage is applied to the first driving body 152, the first driving body 152 is elongated as indicated by an arrow f8 in FIG. 26, and the second driving end 153a is driven via the fixture 154 and the second driving body 153 as indicated by an arrow f9. Thus, the slider 104 is rotationally driven as indicated by an arrow f10.

On the other hand, when the voltage is applied to the second driving body 153, the second driving body 153 is elongated as indicated by an arrow f11 in FIG. 27, and the second driving section 153a is driven as indicated by an arrow f12. Thus, the slider 104 is rotationally driven as indicated by an arrow f13.

In this way, applying the voltage to the first driving body 152 and the second driving body 153 at different times causes the slider 104 to be rotationally driven from side to side. In order to provide a large amount of rotation, the second driving end 153a is desirably fixed near the center of gravity of the slider 104.

In the following, a method for producing the piezoelectric actuator according to the seventh embodiment will be described.

The first driving body and second driving body forming the driving section are first produced. While the first and second driving bodies may be produced in various ways, the following description will be made taking the green sheet method as an example.

Figure 28:
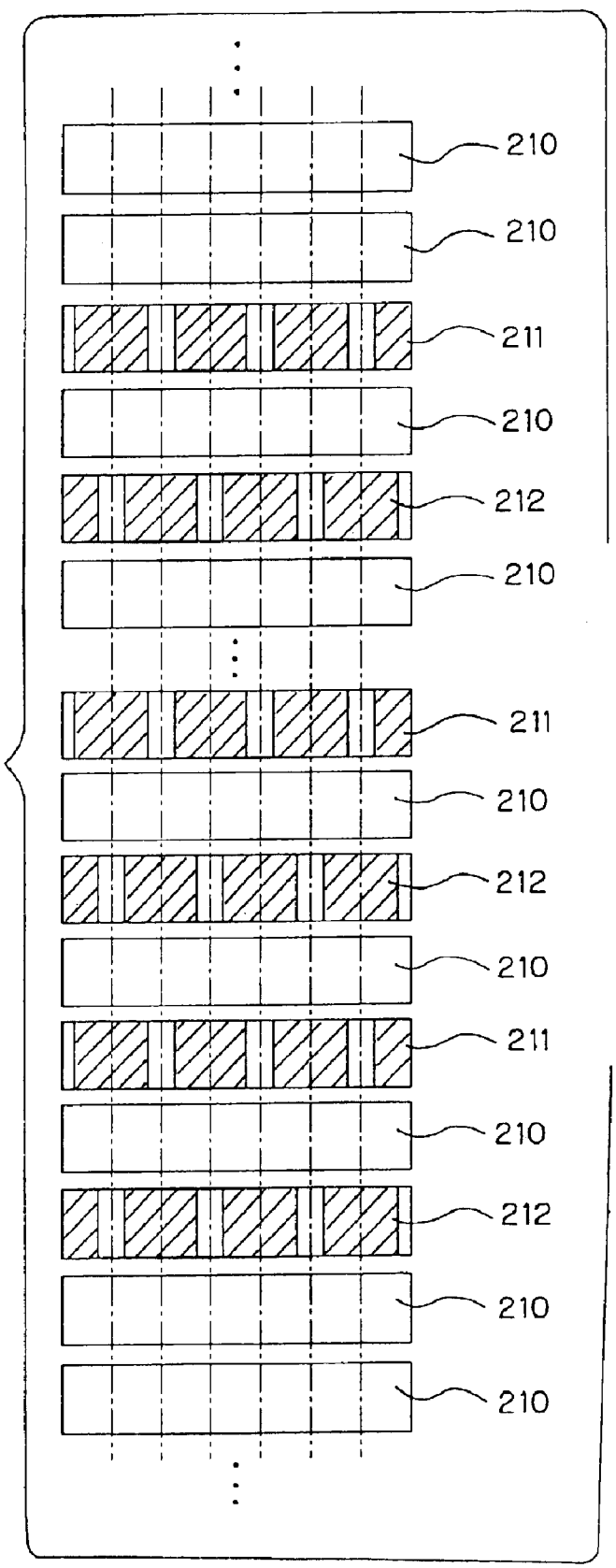
FIG. 28 illustrates the first half of a method for producing the first and second driving bodies.

FIG. 28 illustrates the first half of a method for producing the first and second driving bodies.

Here, layers described below are stacked to form a multilayer structure.

First, a desired number of layers of green sheets 210 made of a piezoelectric material are repeatedly stacked to form a part which constitutes one end of the first driving body or second driving body.

Then, a first electrode layer 211 made of a conductive material having a predetermined pattern is screen-printed on the green sheets 210, and a layer of green sheet 210 is further formed thereon. On this green sheet 210, a second electrode layer 212 having an inverse pattern of the pattern of the first electrode layer 211 is screen-printed, and a layer of green sheet 210 is further formed thereon. A desired number of such layers of green sheet 210, a desired number of layers of first electrode layers 211 and second electrode layers 212 are repeatedly stacked to form a driving section.

Furthermore, a desired number of layers of green sheet 210 are repeatedly stacked.

The stack body comprising these stacked layers is then degreased and burned in the atmosphere to provide a burned body.

Figure 29:
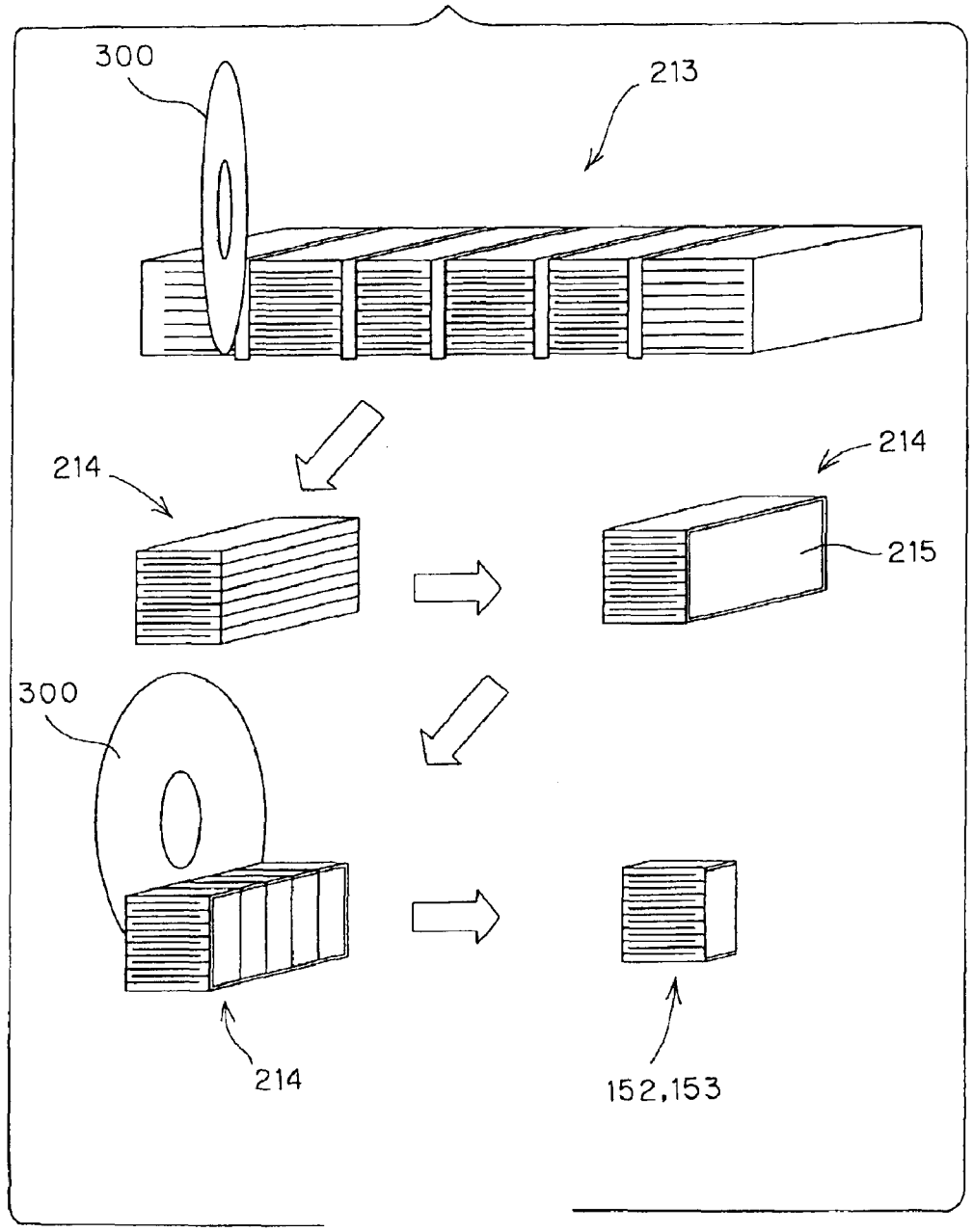
FIG. 29 illustrates the latter half of the method for producing the first and second driving bodies.

FIG. 29 illustrates the latter half of the method for producing the first and second driving bodies.

The burned body 213 thus formed is cut by the saw 300 into intermediate bodies 214 as indicated by alternate long and short dash lines in FIG. 28. On a side surface of each of the intermediate bodies 214, a side electrode 215 for interconnecting the first electrode layers and a side electrode (not shown) for interconnecting the second electrode layers are provided. The voltage is applied to the first and second driving bodies via these side electrodes.

Each intermediate body 214 having the side electrode 215 thus provided thereon is further cut by the saw 300 to provide the first driving body 152 and the second driving body 153.

In this way, the first driving body 152 and the second driving body 153 thus formed are fixed by the fixture to provide the driving section 151 shown in FIG. 24. The driving section 151 is secured to the suspension 108 shown in FIG. 25 to provide the piezoelectric actuator according to the seventh embodiment described above.

Figure 30:
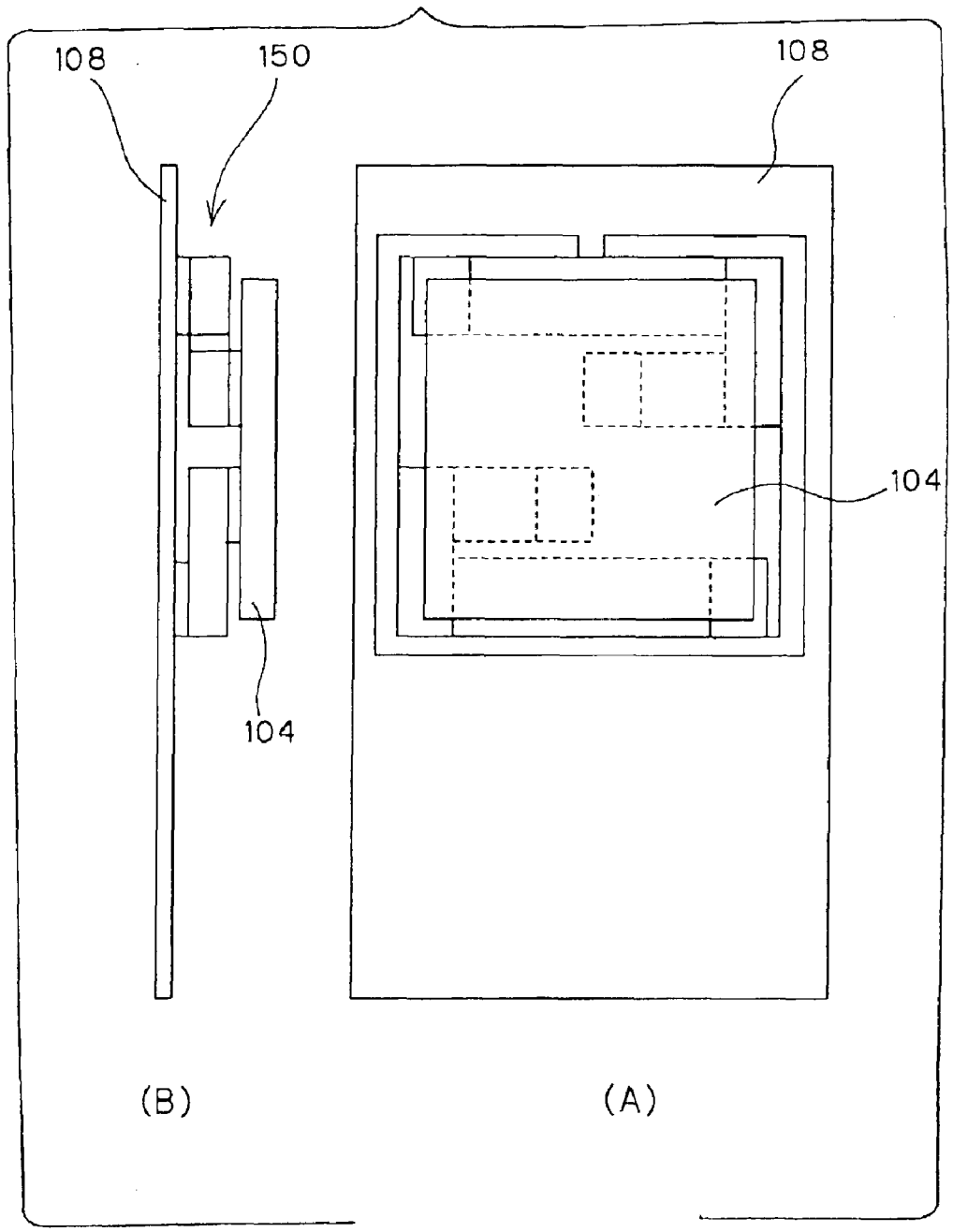
FIG. 30 shows an eighth embodiment of the present invention.

FIG. 30 shows an eighth embodiment of the present invention.

FIG. 30(A) is a front view, and FIG. 30(B) is a side view.

According to the eighth embodiment, the piezoelectric actuator 150 is secured to the suspension 108, and the slider 104 is secured to the piezoelectric actuator 150. The slider 104 is driven according to the same principle as in the seventh embodiment described above. The eighth embodiment has an advantage over the seventh embodiment in that the suspension 108 has a simple structure and is easily produced.

While the hard disk drive has been described above as one example of the information storage device, the information storage device of the present invention may be an optical disk device or magneto-optical disk device as far as the head is held and moved by the arm.

As described above, the piezoelectric actuator according to the present invention is compact and lightweight, and the driving method according to the present invention provide a large displacement at a low voltage. Furthermore, the information storage device according to the present invention can be realized as a compact and lightweight device with a high recording density that has a small moment of inertia of the head when the head is driven.

What is claimed is:

1. A piezoelectric actuator, characterized in that the piezoelectric actuator comprises:
   a first rod-shaped driving section that is longitudinally shrunk or elongated when a voltage, is applied thereto or removed therefrom;
   a second rod-shaped driving section that is disposed in parallel with the first driving section and is longitudinally shrunk or elongated when a voltage is applied thereto or removed therefrom;
   a first end section to which both of one end of the first driving section and one end, which is located beside the one end of the first driving section, of the second driving section are connected;
   a first central section connected to the other end of the first driving section of which one end is connected to the first end section;
   a second central section connected to the other end of the second driving section of which one end is connected to the first end section;
   a third rod-shaped driving section that extends from the first central section in a direction opposite to the first driving section and is longitudinally shrunk or elongated when a voltage is applied thereto or removed therefrom;
   a fourth rod-shaped driving section that extends from the second central section in a direction opposite to the second driving section and is longitudinally shrunk or elongated when a voltage is applied thereto or removed therefrom; and
   a second end section to which the other end of the third driving section than one end connected to the first central section and the other end of the fourth driving section than one end connected to the second central section are connected.

2. The piezoelectric actuator according to claim 1, characterized in that the piezoelectric actuator has a projection extending from at least one of the first end section, the first central section, the second central section and the second end section in a direction in which the first driving section and the second driving section are disposed side by side.

3. The piezoelectric actuator according to claim 1, characterized in that each of the first driving section, the second driving section, the third driving section and the fourth driving section comprises a plurality of piezoelectric layers made of a piezoelectric material, a plurality of electrode layers made of a conductive material and interleaved with the piezoelectric layers, and a via that penetrates the piezoelectric layers and interconnects the electrode layers at a same potential.

4. The piezoelectric actuator according to claim 1, characterized in that the piezoelectric actuator comprises a plurality of stacked driving stages each having the first driving section, the second driving section, the first end section, the first central section, the second central section, the third driving section, the fourth driving section and the second end section disposed in a planar arrangement, a 2N-th driving stage (N being an integer) and a 2N+1-th driving stage of the plurality of driving stages are connected to each other at one of an end section pair of the first end section and the second end section and a central section pair of the first central section and the second central section, and the 2N-th driving stage and a 2N−1-th driving stage of the plurality of driving stages are connected to each other at the other of the end section pair and the central section pair.

5. A piezoelectric actuator, characterized in that the piezoelectric actuator comprises:

a plurality of driving sections each of which has a first driving end and a second driving end and drives the second driving end back and forth relative to the first driving end in a predetermined driving direction; and a base to which the first driving ends of the plurality of driving sections are fixed and which holds the plurality of driving sections in a rotational symmetry and line asymmetry arrangement as a whole, and the driving section comprises:

a first rod-shaped driving body that extends from the first driving end in the driving direction and is longitudinally shrunk or elongated when a voltage is applied thereto or removed therefrom;

a second rod-shaped driving body that extends from the second driving end, in the same direction as the first driving body, and in parallel with the first driving body and is longitudinally shrunk or elongated when a voltage is applied thereto or removed therefrom; and a fixture that fixes the other end of the first driving body than one end connected to the first driving end and the other end of the second driving body than one end connected to the second driving end.

6. A driving method, characterized in that the method is for driving a piezoelectric actuator comprising:

a first rod-shaped driving section that is longitudinally shrunk or elongated when a voltage is applied thereto or removed therefrom;

a second rod-shaped driving section that is disposed in parallel with the first driving section and is longitudinally shrunk or elongated when a voltage is applied thereto or removed therefrom;

a first end section to which both of one end of the first driving section and one end, which is located beside the one end of the first driving section, of the second driving section are connected;

a first central section to which the other end of the first driving section is connected;

a second central section to which the other end of the second driving section is connected;

a third rod-shaped driving section that extends from the first central section in a direction opposite to the first driving section and is longitudinally shrunk or elongated when a voltage is applied thereto or removed therefrom;

a fourth rod-shaped driving section that extends from the second central section in a direction opposite to the second driving section and is longitudinally shrunk or elongated when a voltage is applied thereto or removed therefrom; and a second end section to which the other end of the third driving section than one end connected to the first central section and the other end of the fourth driving section than one end connected to the second central section are connected, and that the voltage is applied to the first driving section and fourth driving section of the piezoelectric actuator at a same time and the voltage is applied to the second driving section and third driving section of the piezoelectric actuator simultaneously at a different time from the time for the first and fourth driving sections, whereby a central section pair of the first central section and the second central section is rotationally driven relative to an end section pair of the first end section and the second end section.

7. An information storage device, characterized in that the information storage device comprises:

a head section on which a head is mounted that performs at least one of information recording in a predetermined information storage medium and information regeneration from the predetermined information storage medium;

an arm section that holds the head section in such a manner that the head mounted on the head section is brought close to or into contact with the information storage medium;

an am, section actuator that drives the arm section to move the head mounted on the head section held by the arm section along the information storage medium; and a head section actuator that rotates the head section relative to the arm section about the center of gravity of the head section, and the head section actuator comprises:

a first rod-shaped driving section that is longitudinally shrunk or elongated when a voltage is applied thereto or removed therefrom;

a second rod-shaped driving section that is disposed in parallel with the first driving section and is longitudinally shrunk or elongated when a voltage is applied thereto or removed therefrom;

a first end section to which both of one end of the first driving section and one end, which is located beside the one end of the first driving section, of the second driving section are connected;

a first central section to which the other end of the first driving section is connected;

a second central section to which the other end of the second driving section is connected;

a third rod-shaped driving section that extends from the first central section in a direction opposite to the first driving section and is longitudinally shrunk or elongated when a voltage is applied thereto or removed therefrom;

a fourth rod-shaped driving section that extends from the second central section in a direction opposite to the second driving section and is longitudinally shrunk or elongated when a voltage is applied thereto or removed therefrom; and a second end section to which the other end of the third driving section than one end connected to the first central section and the other end of the fourth driving section than one end connected to the second central section are connected.

8. An information storage device, characterized in that the information storage device comprises:

a head section on which a head is mounted that performs at least one of information recording in a predetermined information storage medium and information regeneration from the predetermined information storage medium;

an arm section that holds the head section in such a manner that the head mounted on the head section is brought close to or into contact with the information storage medium;

an arm section actuator that drives the arm section to move the head mounted on the head section held by the arm section along the information storage medium; and a head section actuator that rotates the head section relative to the arm section about the center of gravity of the head section, the head section actuator comprises a plurality of driving sections each of which has a first driving end fixed to the arm section and a second driving end fixed to the head section and drives the second driving end relative to the first driving end in a predetermined driving direction, the driving sections being held in a rotational symmetry and line asymmetry arrangement as a whole, and the driving section comprises:

a first rod-shaped driving body that extends from the first driving end in the driving direction and is longitudinally shrunk or elongated when a voltage is applied thereto or removed therefrom;

a second rod-shaped driving body that extends from the second driving end, in the same direction as the first driving body, and in parallel with the first driving body and is longitudinally shrunk or elongated when a voltage is applied thereto or removed therefrom; and a fixture that fixes the other end of the first driving body than one end connected to the first driving end and the other end of the second driving body than one end connected to the second driving end.

* * * * *

UNITED STATES PATENT AND TRADEMARK OFFICE
CERTIFICATE OF CORRECTION

PATENT NO. : 6,870,710 B2
DATED : March 22, 2005
INVENTOR(S) : Masaharu Hida et al.

It is certified that error appears in the above-identified patent and that said Letters Patent is hereby corrected as shown below:

Column 16,
Line 16, delete the comma (",") between "voltage" and "is".

Column 18,
Line 22, delete "an am, section" and insert -- an arm section -- therefor.

Signed and Sealed this

Second Day of August, 2005

JON W. DUDAS
*Director of the United States Patent and Trademark Office*